(12) United States Patent
Choi et al.

(10) Patent No.: US 12,230,630 B2
(45) Date of Patent: Feb. 18, 2025

(54) SEMICONDUCTOR DEVICES HAVING HIGHLY INTEGRATED SHEET AND WIRE PATTERNS THEREIN

(71) Applicant: Samsung Electronics Co., Ltd., Suwon-si (KR)

(72) Inventors: Kyung In Choi, Seoul (KR); Do Young Choi, Hwaseong-si (KR); Dong Myoung Kim, Suwon-si (KR); Jin Bum Kim, Seoul (KR); Hae Jun Yu, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 631 days.

(21) Appl. No.: 17/571,954

(22) Filed: Jan. 10, 2022

(65) Prior Publication Data

US 2022/0399330 A1 Dec. 15, 2022

(30) Foreign Application Priority Data

Jun. 11, 2021 (KR) .................. 10-2021-0075786

(51) Int. Cl.
*H01L 27/088* (2006.01)
*H01L 21/8234* (2006.01)

(52) U.S. Cl.
CPC .... *H01L 27/088* (2013.01); *H01L 21/823412* (2013.01); *H01L 21/823462* (2013.01)

(58) Field of Classification Search
None
See application file for complete search history.

(56) References Cited

U.S. PATENT DOCUMENTS

| | | | |
|---|---|---|---|
| 8,513,125 B2 | 8/2013 | Saracco et al. | |
| 9,627,273 B2 | 4/2017 | Kim | |
| 9,716,142 B2 | 7/2017 | Bi et al. | |
| 9,984,938 B2 | 5/2018 | Ching et al. | |
| 10,074,573 B2 | 9/2018 | Kim et al. | |
| 10,224,343 B2* | 3/2019 | Kim | H01L 29/42392 |
| 10,886,368 B2 | 1/2021 | Zhang et al. | |
| 11,069,681 B2* | 7/2021 | Shin | H01L 29/0673 |
| 2018/0254322 A1 | 9/2018 | Cheng et al. | |
| 2019/0198639 A1* | 6/2019 | Kim | H01L 29/66795 |

* cited by examiner

*Primary Examiner* — Bilkis Jahan
(74) *Attorney, Agent, or Firm* — MORGAN, LEWIS & BOCKIUS LLP

(57) ABSTRACT

A semiconductor device includes a semiconductor substrate having first and second regions therein, a first lower semiconductor pattern, which protrudes from the semiconductor substrate in the first region and extends in a first direction across the semiconductor substrate, and a first gate electrode, which extends across the first lower semiconductor pattern and the semiconductor substrate in a second direction. A plurality of semiconductor sheet patterns are provided, which are spaced apart from each other in a third direction to thereby define a vertical stack of semiconductor sheet patterns, on the first lower semiconductor pattern. A first gate insulating film is provided, which separates the plurality of semiconductor sheet patterns from the first gate electrode. A second lower semiconductor pattern is provided, which protrudes from the semiconductor substrate in the second region. A plurality of wire patterns are provided, which are spaced apart from each other on the second lower semiconductor pattern. A second gate insulating film is wrapped around each of the plurality of wire patterns.

20 Claims, 32 Drawing Sheets

SEMICONDUCTOR DEVICES HAVING HIGHLY INTEGRATED SHEET AND WIRE PATTERNS THEREIN

REFERENCE TO PRIORITY APPLICATION

This application claims priority under 35 U.S.C. 119 to Korean Patent Application No. 10-2021-0075786, filed Jun. 11, 2021, the disclosure of which is hereby incorporated herein by reference.

BACKGROUND

The present disclosure relates to semiconductor devices and, more particularly, to highly integrated semiconductor devices with vertically integrated components therein.

As one of many scaling technologies for increasing density of a semiconductor device, a multi gate transistor in which a fin or nanowire-shaped multi-channel active pattern (or a silicon body) is formed on a substrate and a gate is formed on a surface of the multi-channel active pattern, has been proposed. Since such a multi gate transistor utilizes three-dimensional channels, scaling is relatively easily performed. Moreover, even if a gate length of the multi gate transistor is not increased, the current control capability may be improved. The SCE (short channel effect), in which potential of a channel region is influenced by a drain voltage, may also be effectively suppressed. Unfortunately, as a pitch size of a semiconductor device decreases, there is an increasing need for a research for securing a decrease in capacitance and electrical stability between contacts within the semiconductor device.

SUMMARY

Aspects of embodiments of the present invention provide semiconductor devices having improved device performance and reliability.

According to aspects of embodiments of the present invention, there is provided a semiconductor device including a substrate (e.g., semiconductor substrate) having first and second regions therein. A first lower semiconductor pattern is provided, which protrudes from the substrate (in the first region) and extends lengthwise in a first direction. A first gate electrode is provided, which extends in a second direction across the first lower semiconductor pattern. A plurality of sheet patterns are provided, which are spaced apart, in a vertical stack of sheet patterns, from the first lower semiconductor pattern in a third direction, which is orthogonal to the first direction and to the second direction. A first gate insulating film is provided, which wraps around each of the plurality of sheet patterns. A second lower semiconductor pattern is provided, which protrudes from the substrate (in the second region) and extends lengthwise in the first direction. A plurality of wire patterns are provided, which are spaced apart in the third direction from the second lower semiconductor pattern. A second gate insulating film is provided, which wraps around each of the wire patterns. In these embodiments, a thickness of the first gate insulating film is less than a thickness of the second gate insulating film, and a distance at which each of the sheet patterns is spaced in the third direction is smaller than a distance at which each of the wire patterns is spaced in the third direction.

According to another embodiment of the present invention, there is provided a semiconductor device, which includes a first region and a second region of a substrate, a first lower semiconductor pattern which protrudes from the substrate of the first region and extends in a first direction, a first gate electrode which extends in a second direction (orthogonal to the first direction) on the first lower semiconductor pattern, and a plurality of sheet patterns, which are spaced apart from the first lower semiconductor pattern in a third direction (orthogonal to the first and second directions). A first gate insulating film is provided, which wraps around each of the plurality of sheet patterns. This first gate insulating film includes a first interface film, and a first high dielectric constant film on the first interface film. A second lower semiconductor pattern is provided, which protrudes from the substrate (in the second region) and extends in the first direction. A second gate electrode is provided, which extends in the second direction on the second lower semiconductor pattern. A plurality of wire patterns are provided, which are spaced apart from the second lower semiconductor pattern in the third direction. A second gate insulating film is provided, which wraps around each of the wire patterns. The second gate insulating film includes a second interface film and a second high dielectric constant film on the second interface film. A thickness of the first interface film is less than a thickness of the second interface film, in some embodiments of the invention.

According to another embodiment of the invention, a semiconductor device is provided, which includes a substrate having at least first and second regions therein. A first lower semiconductor pattern is provided, which protrudes from the first region and extends lengthwise in a first direction across the substrate. A first gate electrode is provided, which extends across the first lower semiconductor pattern in a second direction that is orthogonal to the first direction. First to third sheet patterns are provided, which are sequentially stacked on the first lower semiconductor pattern in a third direction, which is orthogonal to the first and second directions. A first gate insulating film is provided, which wraps around the first to third sheet patterns. This first gate insulating film includes a first interface film, and a first high dielectric constant film on the first interface film. A second lower semiconductor pattern is provided, which protrudes from the second region and extends lengthwise across the substrate in the first direction. A second gate electrode is provided, which extends in the second direction on the second lower semiconductor pattern. First to third wire patterns are provided, which are vertically stacked in the third direction on the second lower semiconductor pattern. A second gate insulating film is provided, which wraps around the first to third wire patterns. The second gate insulating film includes a second interface film and a second high dielectric constant film on the second interface film. In addition, from a viewpoint of a cross-sectional area, the first wire pattern includes a first surface extending in the second direction, and a second surface connected to both ends of the first surface (and having a concave curved surface with respect to the second lower pattern). Likewise, from a viewpoint of the cross-sectional area, the second wire pattern includes a first sub-wire pattern, in which a width in the second direction gradually increases as it gets farther from the second lower pattern, and a second sub-wire pattern, which is placed on the first sub-wire pattern and has a width in the second direction that gradually decreases as it gets farther from the second lower pattern. A height of the first sub-wire pattern in the third direction may be smaller than a height of the second sub-wire pattern in the third direction. And, from a viewpoint of the cross-sectional area, the third wire pattern may have an elliptical shape in which a width in the second direction is smaller than a width in the third direction.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Although the drawings of a semiconductor device described herein show a fin-type transistor (FinFET) including a channel region of a fin-type pattern shape, a transistor including a nanowire or a nanosheet, and a MBCFET™ (Multi-Bridge Channel Field Effect Transistor) as an example, the embodiments are not limited thereto. For example, the semiconductor device according to some embodiments may include a tunneling transistor (tunneling FET) or a three-dimensional (3D) transistor. The semiconductor device according to some embodiments may also include a planar transistor. In addition, the many technical concepts described in this specification may be applied to transistors based on two-dimensional materials (2D material based FETs) and heterostructures thereof. Furthermore, semiconductor devices according to some embodiments may also include a bipolar junction transistor, a laterally diffused metal oxide semiconductor (LDMOS), or the like.

Figure 1:
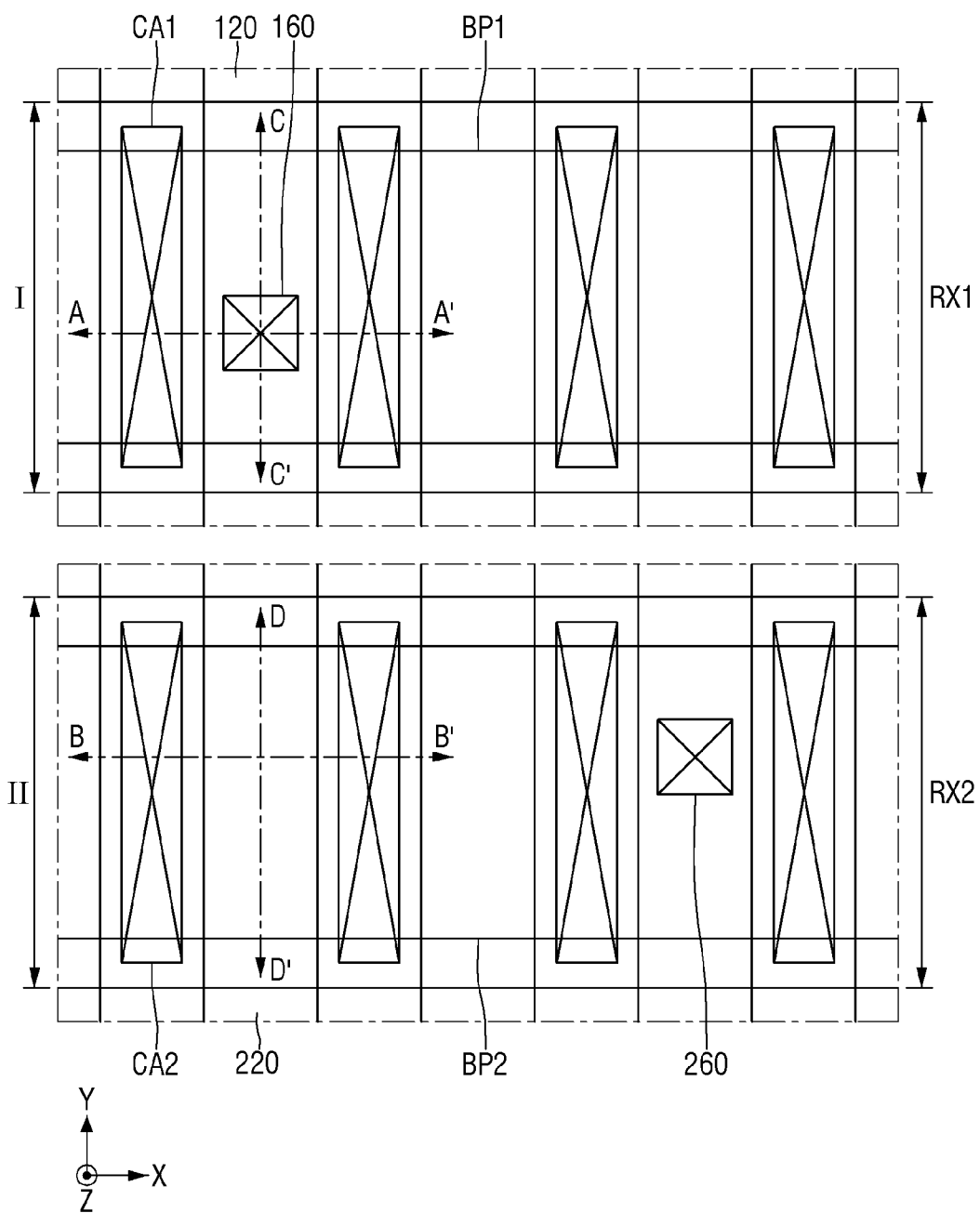
FIG. 1 is an exemplary plan layout diagram of a semiconductor device according to some embodiments.
Figure 2:
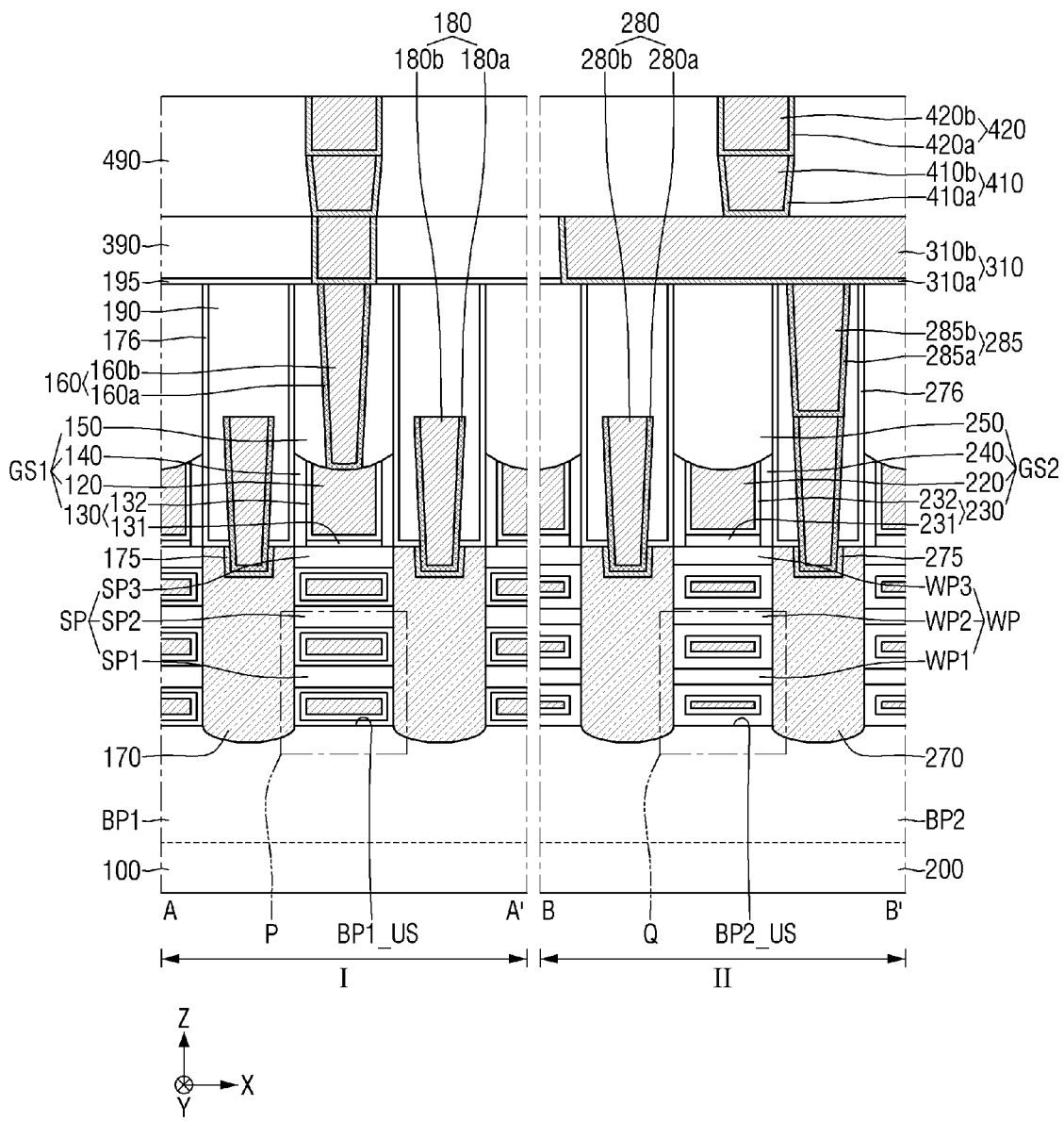
FIG. 2 is an exemplary cross-sectional view taken along lines A-A' and B-B' of FIG. 1.
Figure 3:
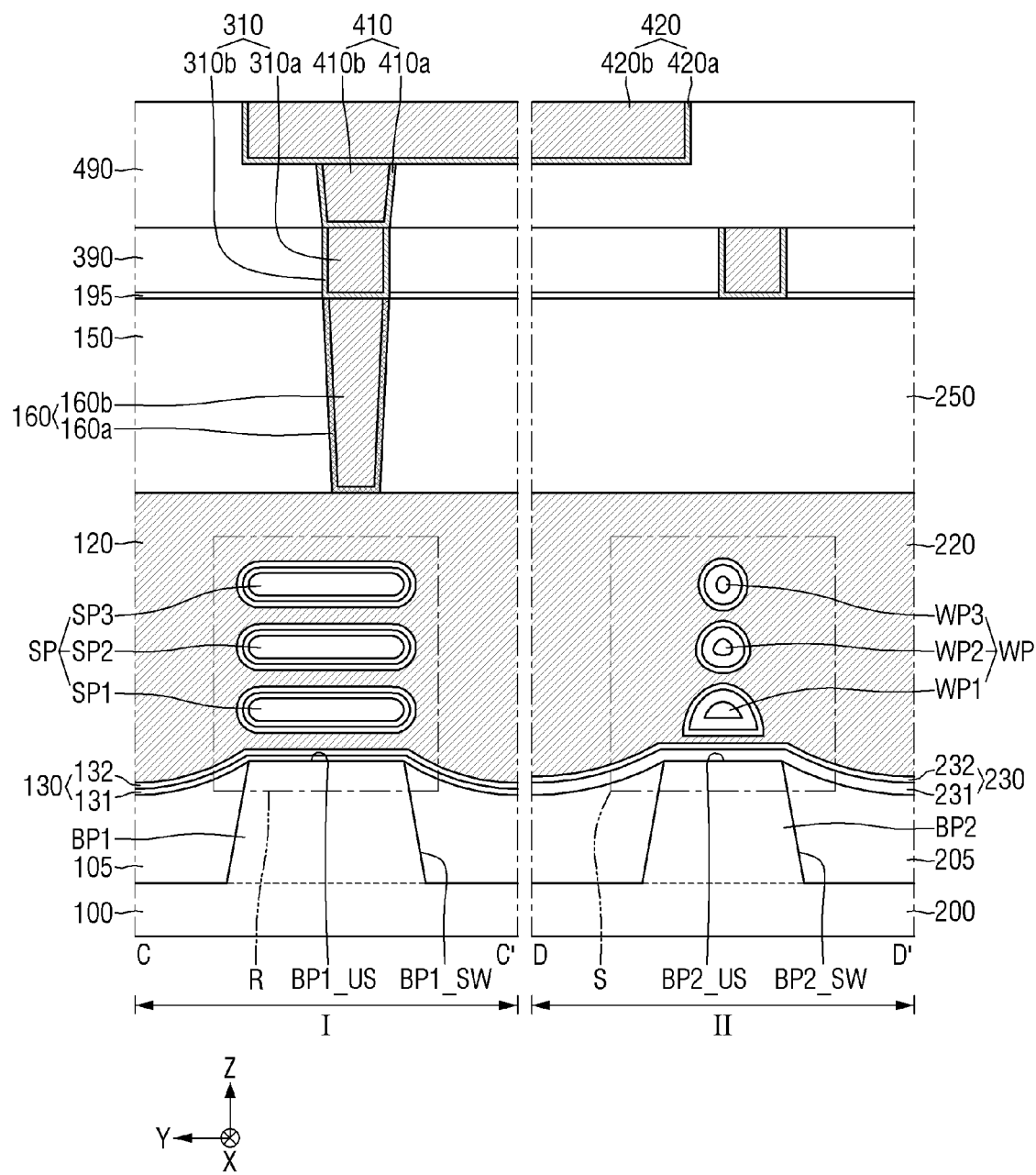
FIG. 3 is an exemplary cross-sectional view taken along lines C-C' and D-D' of FIG. 1.

FIG. 1 is an exemplary layout diagram for explaining a semiconductor device according to some embodiments. FIG. 2 is an exemplary cross-sectional view taken along lines A-A' and B-B' of FIG. 1, and FIG. 3 is an exemplary cross-sectional view taken along lines C-C' and D-D' of FIG. 1. Referring to FIGS. 1 to 3, the semiconductor device according to some embodiments may include a first substrate 100, a second substrate 200, a first gate electrode 120, a second gate electrode 220, a first active contact CA1, a second active contact CA2, a first gate contact 160, and a second gate contact 260. The first substrate 100 may be formed in a first region I. The second substrate 200 may be formed in a second region II. The first region I and the second region II may be, but are not limited to, regions adjacent to each other and may be regions spaced apart from each other.

In some embodiments, the first region I may be, for example, a region in which a first drive voltage transistor is formed. The second region II may be, for example, a region in which a second drive voltage transistor is formed. The first drive voltage may be lower than the second drive voltage. For example, the first transistor may be a transistor used for a low voltage. The second transistor may be a transistor used for a high voltage.

The first substrate 100 may include a first active region RX1. The second substrate 200 may include a second active region RX2. Although not shown, a first field region may be formed on both sides of the first active region RX1 to be directly adjacent to the first active region RX1. Similarly, a second field region may be formed on both sides of the second active region RX2 to be directly adjacent to the second active region RX2. The first active region RX1 may be separated by the first field region. The second active region RX2 may be separated by the second field region.

Explained by another method, an element isolation film may be placed around the first active region RX1. At this time, a portion of the element isolation film between the first active regions RX1 spaced apart from each other may be the first field region. The element isolation film may be placed around the second active region RX2. At this time, a portion of the element isolation film between the second active regions RX2 spaced apart from each other may be the second field region.

For example, a portion in which a channel region of the transistor is formed may be the active region, and a portion that divides the channel region of the transistor formed in the active region may be the field region. Alternatively, the active region may be a portion in which a nanosheet or a nanowire used as the channel region of the transistor is formed, and the field region may be a region in which the nanosheet or nanowire used as the channel region is not formed.

In some embodiments, one of the first active region RX1 or the second active region RX2 may be a PMOS formation region and the other may be an NMOS formation region. In another embodiment, the first active region RX1 and the second active region RX2 may be the PMOS formation region. In another embodiment, the first active region RX1 and the second active region RX2 may be the NMOS formation region.

The first substrate 100 and the second substrate 200 may be a silicon substrate or a SOI (silicon-on-insulator) substrate, for example. In contrast, the substrate 100 may include, but is not limited to, silicon germanium, SGOI (silicon germanium on insulator), indium antimonide, lead tellurium compounds, indium arsenic, indium phosphide, gallium arsenide or gallium antimonide.

A first lower pattern BP1 may be formed on the first active region RX1. The first lower pattern BP1 may protrude from the first substrate 100. The first lower pattern BP1 may extend long along a first direction X on the first substrate 100. For example, the first lower pattern BP1 may include a long side extending in the first direction X, and a short side extending in a second direction Y. Here, the first direction X may intersect the second direction Y and a third direction Z. Also, the second direction Y may intersect the third direction Z. A second lower pattern BP2 may be formed in the second active region RX2. The second lower pattern BP2 may protrude from the second substrate 200. The second lower pattern BP2 may extend long along the first direction X on the second substrate 200. For example, the second lower pattern BP2 may include a long side extending in the first direction X, and a short side extending in the second direction Y.

In some embodiments, a plurality of sheet patterns SP may be included on the first lower pattern BP1. Although the three sheet patterns SP are shown, this is only for convenience of explanation, and the embodiments described herein are not limited thereto.

The plurality of sheet patterns SP may include a first sheet pattern SP1, a second sheet pattern SP2, and a third sheet pattern SP3. The first sheet pattern SP1, the second sheet pattern SP2, and the third sheet pattern SP3 may be sequentially placed on the first lower pattern BP1. The first sheet pattern SP1, the second sheet pattern SP2, and the third sheet pattern SP3 may be spaced apart from each other in the third direction Z (in a vertical stack). The first sheet pattern SP1 may be located between the second sheet pattern SP2 and the first lower pattern BP1. The second sheet pattern SP2 may be located between the third sheet pattern SP3 and the first sheet pattern SP1. The sheet pattern SP may penetrate the first gate electrode 120 and be connected to a first source/drain pattern 170. The sheet pattern SP may be a channel pattern which is used as a channel region of a transistor. For example, the sheet pattern SP may be a nanosheet.

A plurality of wire patterns WP may be included on the second lower pattern BP2. Although the three wire patterns WP are shown, this is only for convenience of explanation, and the embodiment is not limited thereto. The plurality of wire patterns WP may include a first wire pattern WP1, a second wire pattern WP2, and a third wire pattern WP3. The first wire pattern WP1, the second wire pattern WP2, and the third wire pattern WP3 may be sequentially placed on the second lower pattern BP2. The first wire pattern WP1, the second wire pattern WP2, and the third wire pattern WP3 may be spaced apart from each other in the third direction Z. The first wire pattern WP1 may be located between the second wire pattern WP2 and the first lower pattern BP2. The second wire pattern WP2 may be located between the third wire pattern WP3 and the first wire pattern WP1.

The wire pattern WP may penetrate the second gate electrode 220, and be connected to the second source/drain pattern 270. The wire pattern WP may be a channel pattern which is used as the channel region of the transistor. For example, the wire pattern WP may be a nanowire.

The first lower pattern BP1 and the sheet pattern SP may each be a part of the first substrate 100, and may include an epitaxial layer that is grown from the first substrate 100. The second lower pattern BP2 and the wire pattern WP may each be a part of the second substrate 200, and may include an epitaxial layer that is grown from the second substrate 200.

The first lower pattern BP1, the sheet pattern SP, the second lower pattern BP2, and the wire pattern WP may include, for example, silicon or germanium, which are elemental semiconductor materials. Further, the first lower pattern BP1, the sheet pattern SP, the second lower pattern BP2, and the wire pattern WP may include a compound semiconductor, and may include, for example, a group IV-IV compound semiconductor or a group III-V compound semiconductor.

The group IV-IV compound semiconductor may include, for example, a binary compound or a ternary compound including at least two or more of carbon (C), silicon (Si), germanium (Ge), and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

A first field insulating film 105 may be formed on the first substrate 100. At least a part of the first field insulating film 105 may be formed over the first active region RX1. In addition, the first field insulating film 105 may be formed on a part of a side wall BP1_SW of the first lower pattern BP1. The first lower pattern BP1 may protrude upward from the upper surface of the first field insulating film 105. That is, an upper surface BP1_US of the first lower pattern BP1 may be formed to be higher than the upper surface of the first field insulating film 105, as illustrated.

A second field insulating film 205 may be formed on the second substrate 200. At least a part of the second field insulating film 205 may be formed over the second active region RX2. The second field insulating film 205 may be formed on a part of a side wall BP2_SW of the second lower pattern BP2. The second lower pattern BP2 may protrude upward from the upper surface of the second field insulating film 205. That is, an upper surface BP2_US of the second lower pattern BP2 may be formed to be higher than the upper surface of the second field insulating film 205, as illustrated.

The first field insulating film 105 and the second field insulating film 205 may include, for example, an oxide film, a nitride film, an oxynitride film or a combination film thereof. The first gate structure GS1 may be placed on the first lower pattern BP1. The second gate structure GS2 may be placed on the second lower pattern BP2. The first gate structure GS1 may intersect the first lower pattern BP1. The second gate structure GS2 may intersect the second lower pattern BP2.

The first gate structure GS1 may include, for example, a first gate electrode 120, a first gate insulating film 130, a first gate spacer 140, and a first gate capping pattern 150. The second gate structure GS2 may include, for example, a second gate electrode 220, a second gate insulating film 230, a second gate spacer 240, and a second gate capping pattern 250. The first gate electrode 120 may be formed on the first lower pattern BP1. The first gate electrode 120 may intersect the first lower pattern BP1. The first gate electrode 120 may include a long side extending in the second direction Y, and a short side extending in the first direction X.

An upper surface of the first gate electrode 120 may be, but is not limited to, a concave curved surface that is recessed toward the first lower pattern BP1. Unlike the shown example, the upper surface of the first gate electrode 120 may be a flat plane. The second gate electrode 220 may be formed on the second lower pattern BP2. The second gate electrode 220 may intersect the second lower pattern BP2. The second gate electrode 220 may include a long side extending in the second direction Y, and a short side extending in the first direction X. An upper surface of the second gate electrode 220 may be, but is not limited to, a concave curved surface that is recessed toward the second lower pattern BP2. Unlike the shown example, the upper surface of the second gate electrode 220 may be a flat plane.

In some embodiments, a volume (and cross-sectional area) of the first gate electrode 120 may be greater than a volume (and cross-sectional area) of the second gate electrode 220. From the viewpoint of a cross-sectional area, a cross-sectional area of the first gate electrode 120 may be greater than a cross-sectional area of the second gate electrode 220. Because the thickness of the first gate insulating film 130 is thinner than the thickness of the second gate insulating film 230, the volume of the first gate electrode 120 may be greater than the volume of the second gate electrode 220.

Each of the first gate electrode 120 and the second gate electrode 220 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

Each of the first gate electrode 120 and the second gate electrode 220 may include a conductive metal oxide, a conductive metal oxynitride, and the like, and may also include an oxidized form of the above-mentioned materials. The first gate spacer 140 may be placed on the side wall of the first gate electrode 120. The first gate spacer 140 may extend in the second direction Y. The second gate spacer 240 may be placed on the side wall of the second gate electrode 220. The second gate spacer 240 may extend in the second direction Y.

Each of the first gate spacer 140 and the second gate spacer 240 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. The first gate insulating film 130 may extend along the side wall and bottom surface of the first gate electrode 120. The first gate insulating film 130 may wrap around the sheet pattern SP. The first gate insulating film 130 may include a first interface film 131 and a first high dielectric constant film 132.

The first interface film 131 may be placed on the upper surface BP1_US of the first lower pattern BP1 and the upper surface of the first field insulating film 105. The first interface film 131 may wrap around the sheet pattern SP. The first interface film 131 may be placed between the sheet pattern SP and the bottom surface of the first gate electrode 120. The first interface film 131 may not extend along the side wall of the first gate spacer 140. Unlike the shown example, the first interface film 131 may not extend along the upper surface of the first field insulating film 105. The first interface film 131 extends along the upper surface of the first lower pattern BP1 and may not extend along the upper surface of the first field insulating film 105.

The first high dielectric constant film 132 may be placed on the first interface film 131. The first high dielectric constant film 132 may wrap around the first interface film 131. The first high dielectric constant film 132 may extend along the side walls and bottom surface of the first gate electrode 120. The second gate insulating film 230 may extend along the side wall and bottom surface of the second gate electrode 220. The second gate insulating film 230 may wrap around the wire pattern WP. The second gate insulating film 230 may include a second interface film 231 and a second high dielectric constant film 232.

As shown, the second interface film 231 may be placed on the upper surface BP2_US of the second lower pattern BP2 and the upper surface of the second field insulating film 205. The second interface film 231 may wrap around the wire pattern WP. The second interface film 231 may be placed between the wire pattern WP and the bottom surface of the second gate electrode 220. The second interface film 231 may not extend along the side wall of the second gate spacer 240. Unlike the shown example, the second interface film 231 may not extend along the upper surface of the second field insulating film 205. The second interface film 231 extends along the upper surface of the second lower pattern BP2, and may not extend along the upper surface of the second field insulating film 205.

The second high dielectric constant film 232 may be placed on the second interface film 231. The second high dielectric constant film 232 may wrap around the second interface film 231. The second high dielectric constant film 232 may extend along the side walls and bottom surface of the second gate electrode 220. The second high dielectric constant film 232 may wrap around the second interface film 231.

The first interface film 131 and the second interface film 231 may include, for example, silicon oxide. The first high dielectric constant film 132 and the second high dielectric constant film 232 may include, for example, a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some other embodiments may include an NC (Negative Capacitance) FET using a negative capacitor. For example, the first gate insulating film 130 and the second gate insulating film 230 may include a ferroelectric material film having ferroelectric properties, and a paraelectric material film having paraelectric properties. For example, the ferroelectric material film may be configured to have a negative capacitance, and the paraelectric material film may be configured to have a positive capacitance. Thus, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y). When the dopant is aluminum (Al), the ferroelectric material film may include 3 to 8 atomic percent (at %) aluminum. Here, a ratio of the dopant may be a ratio of aluminum to the sum of hafnium and aluminum. In contrast, when the dopant is silicon (Si), the ferroelectric material film may include 2 to 10 atomic percent silicon. When the dopant is yttrium (Y), the ferroelectric material film may include 2 to 10 atomic percent yttrium. When the dopant is gadolinium (Gd), the ferroelectric material film may include 1 to 7 atomic percent gadolinium. When the dopant is zirconium (Zr), the ferroelectric material film may include 50 to 80 atomic percent zirconium.

The paraelectric material film may have paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, but is not limited to, for example, 0.5 nm to 10 nm. Since a critical thickness that exhibits the ferroelectric properties may vary for each ferroelectric material, the thickness of the ferroelectric material film may vary depending on the ferroelectric material.

In some embodiments, the first gate insulating film 130 and the second gate insulating film 230 may include a single ferroelectric material film. In another embodiment, the first gate insulating film 130 and the second gate insulating film 230 may include a plurality of ferroelectric material films spaced apart from each other. The first gate insulating film 130 and the second gate insulating film 230 may have a stacked film structure in which a plurality of ferroelectric material films and a plurality of paraelectric material films are stacked in an alternating arrangement of films.

The first gate capping pattern 150 may be placed on the upper surface of the first gate electrode 120 and the upper surface of the first gate spacer 140. Unlike the shown example, the first gate capping pattern 150 may be placed between the first gate spacers 140. In such a case, the upper surface of the first gate capping pattern 150 may be placed in the same plane as the upper surface of the first gate spacer 140. The upper surface of the first gate capping pattern 150 may be an upper surface of the first gate structure GS1.

The second gate capping pattern 250 may be placed on the upper surface of the second gate electrode 220 and the upper surface of the second gate spacer 240. Unlike the shown example, the second gate capping pattern 250 may be placed between the second gate spacers 240. In such a case, the upper surface of the second gate capping pattern 250 may be placed in the same plane as the upper surface of the second gate spacer 240. The upper surface of the second gate capping pattern 250 may be an upper surface of the second gate structure GS2.

The first gate capping pattern 150 and the second gate capping pattern 250 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

A first source/drain pattern 170 may be formed on the first lower pattern BP1. The first source/drain pattern 170 may be placed between the first gate structures GS1. The first source/drain pattern 170 may be placed on the side surface of the first gate structure GS1. The first source/drain pattern 170 may be placed between the adjacent first gate structures GS1.

In some embodiments, the first source/drain pattern 170 may be placed on both sides of the first gate structure GS1. Unlike the shown example, the first source/drain pattern 170 is located on one side of the first gate structure GS1, but may not be placed on the other side of the first gate structure GS1. In addition, a second source/drain pattern 270 may be formed on the second lower pattern BP2. The second source/drain pattern 270 may be placed between the second gate structures GS2. The second source/drain pattern 270 may be placed on the side surface of the second gate structure GS2. The second source/drain pattern 270 may be placed between adjacent second gate structures GS2.

In other embodiments, the second source/drain pattern 270 may be placed on both sides of the second gate structure GS2. Unlike the shown example, the second source/drain pattern 270 is located on one side of the second gate structure GS2, but may not be placed on the other side of the second gate structure GS2.

The first source/drain pattern 170 and the second source/drain pattern 270 may include an epitaxial pattern. That is, the first source/drain pattern 170 may be included in a source/drain region of a transistor that uses the sheet pattern SP as a channel region. The second source/drain pattern 270 may be included in a source/drain region of a transistor that uses the wire pattern WP as the channel region.

In some embodiments, a first etching stop film 176 may be placed on the upper surface of the first source/drain pattern 170, the side wall of the first gate structure GS1, and the side wall of the first source/drain pattern 170. The first etching stop film 176 may extend to the upper surface of the first gate capping pattern 150. A second etching stop film 276 may be placed on the upper surface of the second source/drain pattern 270, the side wall of the second gate structure GS2, and the side wall of the second source/drain pattern 270. Although it is not shown, the first etching stop film 176 and the second etching stop film 276 may not be formed.

The first etching stop film 176 and the second etching stop film 276 may include, for example, a material having an etching selectivity with respect to the first interlayer insulating film 190. The first etching stop film 176 and the second etching stop film 276 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

A first active contact CA1 may be placed on the first active region RX1. A second active contact CA2 may be placed on the second active region RX2. The first active contact CA1 may be connected to the first source/drain pattern 170 formed in the first active region RX1. The second active contact CA2 may be connected to a second source/drain pattern 270 formed in the second active region RX2. In some embodiments, the first active contact CA1 may include a first lower active contact 180 and a first upper active contact. Although it is not shown, the first upper active contact may be placed on the first lower active contact 180.

The first lower active contact 180 may be formed on the first source/drain pattern 170. The first lower active contact 180 may be connected to the first source/drain pattern 170. Although the upper surface of the first lower active contact 180 is shown to be formed higher than the upper surface of the gate electrode 120, this is only for convenience of explanation, and the embodiment is not limited thereto. The upper surface of the first lower active contact 180 may, of course, be formed to be lower than the upper surface of the gate electrode 120.

A first silicide film 175 may be formed between the first lower active contact 180 and the first source/drain pattern 170. Although the first silicide film 175 is shown to be formed along a profile of an interface between the first source/drain pattern 170 and the first lower active contact 180, the embodiment is not limited thereto. The first silicide film 175 may include, for example, a metal silicide material.

The first lower active contact 180 may be formed of multiple films. The first lower active contact 180 may include, for example, a first lower active contact barrier film 180a and a first lower active contact filling film 180b. The first lower active contact filling film 180b may be placed on the first lower active contact barrier film 180a. The first lower active contact barrier film 180a may extend along the side walls and bottom surface of the first lower active contact filling film 180b.

The first lower active contact barrier film 180a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. In the semiconductor device according to some embodiments, the two-dimensional material may be a metallic material and/or a semiconductor material. The two-dimensional (2D material) may include a two-dimensional allotrope or a two-dimensional compound, and may include, but is not limited to, for example, at least one of graphene, molybdenum disulfide ($MoS_2$), molybdenum diselenide ($MoSe_2$), tungsten diselenide ($WSe_2$), and tungsten disulfide ($WS_2$). That is, since the above-mentioned two-dimensional materials are only listed by way of example, the two-dimensional materials that may be included in the semiconductor device of the present disclosure are not limited by the above-mentioned materials. A first lower active contact filling film 180b may include, for example, at least one of aluminum (Al), tungsten (W), cobalt (Co), ruthenium (Ru), silver (Ag), gold (Au), manganese (Mn), and molybdenum (Mo).

The second active contact CA2 may include a second lower active contact 280 and a second upper active contact 285. The description of the second lower active contact 280 may be the same as the description of the first lower active contact 180. A second silicide film 275 may be formed between the second lower active contact 280 and the second source/drain pattern 270. Although the second silicide film 275 is shown to be formed along a profile of an interface between the second source/drain pattern 270 and the second lower active contact 280, the embodiment is not limited thereto. The second silicide film 275 may include, for example, a metal silicide material.

The second lower active contact 280 may be formed of multiple films. The second lower active contact 280 may include, for example, a second lower active contact barrier film 280a and a second lower active contact filling film 280b. The second lower active contact filling film 280b may be placed on the second lower active contact barrier film 280a. The second lower active contact barrier film 280a may be placed along the side walls and bottom surface of the second lower active contact filling film 280b.

The description of the materials included in the second lower active contact barrier film 280a and the second lower active contact filling film 280b may be the same as the description of the first lower active contact barrier film 180a and the first lower active contact filling film 180b.

The second upper active contact 285 may be placed on the second lower active contact 280. The second upper active contact 285 may be connected to the second lower active contact 280. That is, the second upper active contact 285 may be connected to the second source/drain pattern 270. The second upper active contact 285 may extend to the upper surface of the first interlayer insulating film 190. That is, the upper surface of the second upper active contact 285 may be placed on the same plane as the upper surface of the first interlayer insulating film 190, the upper surface of the first gate contact 160, the upper surface of the second gate capping pattern 250, and the upper surface of the first gate capping pattern 150. In addition, the second upper active contact 285 may be formed of multiple films. The second upper active contact 285 may include, for example, a second upper active contact barrier film 285a and a second upper active contact filling film 285b. The second upper active contact filling film 285b may be placed on the second upper active contact barrier film 285a. The second upper active contact barrier film 285a may be placed along the side walls and bottom surface of the second upper active contact filling film 285b. The description of the materials included in the second upper active contact barrier film 285a and the second upper active contact filling film 285b may be the same as the above description of the first lower active contact barrier film 180a and the first lower active contact filling film 180b.

The first gate contact 160 may be placed on the first active region RX1. The second gate contact 260 may be placed on the second active region RX2. Since the first gate contact 160 and the second gate contact 260 may be substantially the same, only the first gate contact 160 will be described below. The first gate contact 160 may be placed inside the first gate structure GS1. The first gate contact 160 may be connected to the first gate electrode 120 included in the first gate structure GS1. The first gate contact 160 may be formed to penetrate the first gate capping pattern 150 in the third direction Z.

The first gate contact 160 may be placed at a position where it overlaps the first gate structure GS1. In some embodiments, at least a part of the first gate contact 160 may be placed at a position where it overlaps the sheet pattern SP. The upper surface of the first gate contact 160 may be placed in the same plane as the upper surface of the first gate capping pattern 150. The upper surface of the first gate contact 160 may be located at the same plane as the upper surface of the second upper active contact 285. The upper surface of the first gate contact 160 may be located in the same plane as the upper surface of the first interlayer insulating film 190.

The first gate contact 160 may be formed of multiple films. The first gate contact 160 may include, for example, a gate contact barrier film 160a and a gate contact filling film 160b. The gate contact filling film 160b may be placed on the gate contact barrier film 160a. The gate contact barrier film 160a may be placed along the side walls and bottom surface of the gate contact filling film 160b. The contents of the materials included in the gate contact barrier film 160a and the gate contact filling film 160b may be the same as the description of the first lower active contact barrier film 180a and the first lower active contact filling film 180b.

The first interlayer insulating film 190 may be formed on the first source/drain pattern 170, the second source/drain pattern 270, the first field insulating film 105, and the second field insulating film 205. The first interlayer insulating film 190 may cover the side wall of the first lower active contact 180, the side wall of the second lower active contact 280, and the side wall of the second upper active contact 285. The first interlayer insulating film 190 may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

In some embodiments, a second interlayer insulating film 390 and a third interlayer insulating film 490 may be formed on the first interlayer insulating film 190. Each of the second interlayer insulating film 390 and the third interlayer insulating film 490 may include, for example, at least one of silicon oxide, silicon nitride, silicon oxynitride and a low dielectric constant material.

In some embodiments, a wiring etching stop film 195 may extend along the upper surface of the first gate capping pattern 150, the upper surface of the first interlayer insulating film 190, the upper surface of the second gate capping pattern 250 and the upper surface of the second upper active contact 285. In addition, the second interlayer insulating film 390 may be placed on the wiring etching stop film 195. The wiring etching stop film 195 may include a material having an etching selectivity with respect to the second interlayer insulating film 390. The wiring etching stop film 195 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC) and a combination thereof.

The first wiring pattern 310 may be placed on the first gate contact 160 and the second upper active contact 285. The first wiring pattern 310 may be connected to the first gate contact 160. The first wiring pattern 310 may be connected to the second upper active contact 285. The first wiring pattern 310 may be formed to penetrate the wiring etching stop film 195. The first wiring pattern 310 may be placed inside the second interlayer insulating film 390. The first wiring pattern 310 may include a portion that comes into direct contact with the second gate capping pattern 250.

The first wiring pattern 310 may have a multiple conductive film structure. The first wiring pattern 310 may include, for example, a first wiring barrier film 310a and a first wiring filling film 310b. The first wiring filling film 310b may be placed on the first wiring barrier film 310a. The first wiring barrier film 310a may be placed along the side walls and bottom surface of the first wiring filling film 310b.

The first wiring barrier film 310a may include, for example, at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. In contrast, the first wiring filling film 310b may include, for example, at least one of aluminum (Al), copper (Cu), tungsten (W), cobalt (Co), ruthenium (Ru), silver (Ag), gold (Au), manganese (Mn), and molybdenum (Mo).

In some embodiments, a via structure 410 and a second wiring pattern 420 may be included on the first wiring pattern 310. The via structure 410 and the second wiring pattern 420 may be placed inside the third interlayer insulating film 490.

The via structure 410 may be formed on the first wiring pattern 310. The via structure 410 may be connected to the first wiring pattern 310. The via structure 410 may be multiple films including a via barrier film 410a and a via filling film 410b. The via filling film 410b may be placed on the via barrier film 410a. The via barrier film 410a may be placed along the side walls and bottom surface of the via filling film 410b.

The via barrier film 410a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. In contrast, the via filling film 410b may include, for example, at least one of aluminum (Al), copper (Cu), tungsten (W), cobalt (Co), ruthenium (Ru), silver (Ag), gold (Au), manganese (Mn), and molybdenum (Mo).

The second wiring pattern 420 may be placed on the via structure 410. The second wiring pattern 420 may be multiple films including a second wiring barrier film 420a and a second wiring filling film 420b. The second wiring filling film 420b may be placed on the second wiring barrier film 420a. The second wiring barrier film 420a may be placed along the side walls and bottom surface of the second wiring filling film 420b. Contents of the materials included in the second wiring barrier film 420a and the second wiring filling film 420b may be the same as the description of the materials included in the first wiring barrier film 310a and the first wiring filling film 310b.

Figure 4:
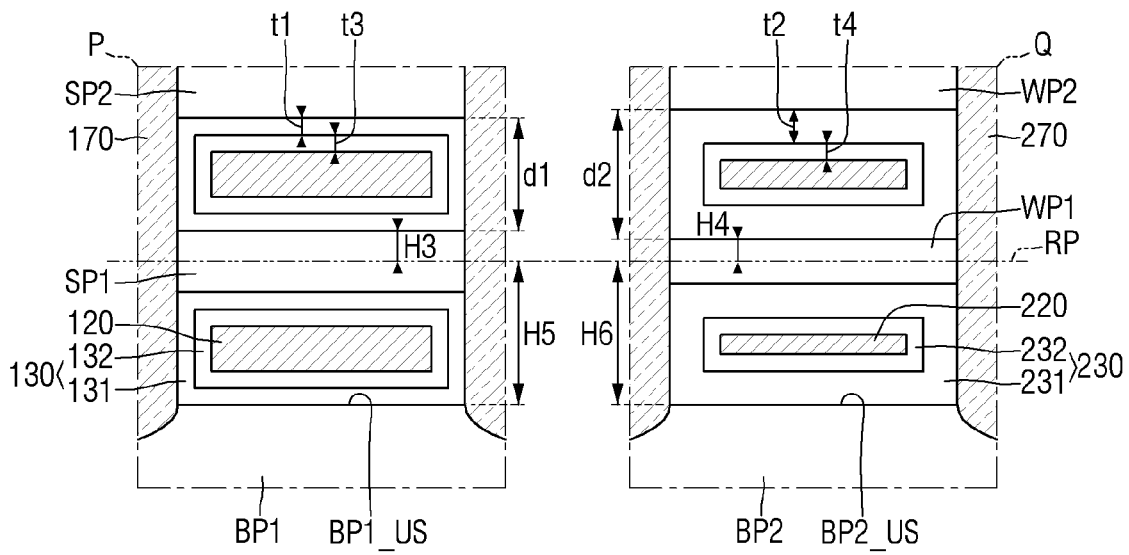
FIG. 4 is an enlarged view of region P and region Q of FIG. 2.
Figure 5:
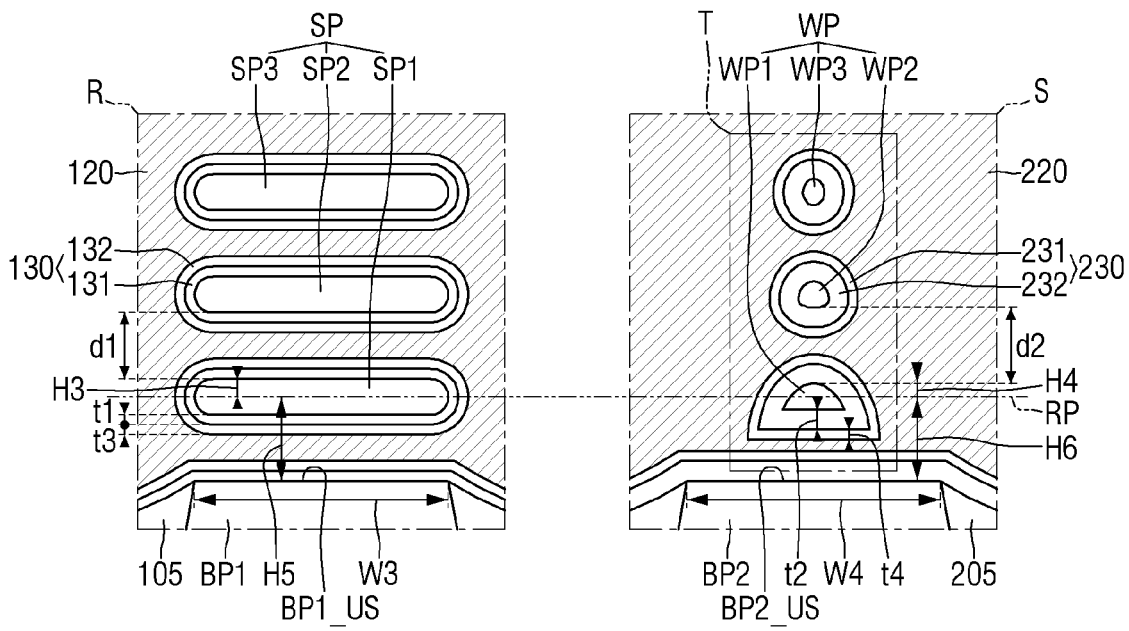
FIG. 5 is an enlarged view of region R and region S of FIG. 3.

FIG. 4 is an enlarged view of a region P and a region Q of FIG. 2. FIG. 5 is an enlarged view of a region R and a region S of FIG. 3. Hereinafter, the sheet pattern SP, the wire pattern WP, the first gate insulating film 130, and the second gate insulating film 230 will be described in a more detail referring to FIGS. 4 and 5.

Referring to FIGS. 4 and 5, a total thickness (t1+t3) of the first gate insulating film 130 may be smaller than a total thickness (t2+t4) of the second gate insulating film 230. In some embodiments, a thickness t1 of the first interface film 131 may be smaller than a thickness t2 of the second interface film 231. As described above, a first drive voltage of the transistor of the first region I may be lower than a second drive voltage of the transistor of the second region II. Therefore, the thickness t1 of the first interface film 131 may be smaller than the thickness t2 of the second interface film 231.

A thickness t3 of the first high dielectric constant film 132 may be the same as a thickness t4 of the second high dielectric constant film 232. The first high dielectric constant film 132 and the second high dielectric constant film 232 may be formed at the same level. As used herein, the term "same level" means formation by the same fabricating process. That is, since the thickness t1 of the first interface film 131 is smaller than the thickness t2 of the second interface film 231, and the thickness t3 of the first high dielectric constant film 132 is the same as the thickness t4 of the second high dielectric constant film 232, the total thickness (t1+t3) of the first gate insulating film 130 is smaller than the total thickness (t2+t4) of the second gate insulating film 230.

In some embodiments, a distance d1 at which the sheet pattern SP is separated in the third direction Z may be smaller than a distance d2 at which the wire pattern WP is separated in the third direction Z. That is, the distance d1 at which the first sheet pattern SP1 and the second sheet pattern SP2 are separated may be smaller than the distance d2 at which the first wire pattern WP1 and the second wire pattern WP2 are separated. Because the distance d2 at which the first wire pattern WP1 and the second wire pattern WP2 are separated from each other is greater than the distance d1 at which the first sheet pattern SP1 and the second sheet pattern SP2 are separated from each other, it is possible to easily form the second interface film 231 as a relatively thick film.

In some embodiments, a height H3 from a reference plane RP to the upper surface of the first sheet pattern SP1 may be greater than is a height H4 from the reference plane RP to the upper surface of the first wire pattern WP1. Here, the reference plane RP may be a virtual plane that passes through a center of the first sheet pattern SP1 and a center of the first wire pattern WP1. The reference plane RP may extend in the first direction X and the second direction Y. That is, a width of the sheet pattern SP in the third direction Z may be greater than a width of the wire pattern WP in the third direction Z.

In some embodiments, an upper surface BP1_US of the first lower pattern BP1 may be placed in the same plane as an upper surface BP2_US of the second lower pattern BP2. A height H5 in the third direction Z from the upper surface BP1_US of the first lower pattern BP1 to the reference plane RP may be the same as a height H6 from the upper surface BP2_US of the second lower pattern BP2 to the reference plane RP. However, the technical idea of the present disclosure is not limited thereto.

In some embodiments, the width of the sheet pattern SP in the first direction X may be the same as the width of the wire pattern WP in the first direction X. The width of the sheet pattern SP in the second direction Y may be greater than the width of the wire pattern WP in the second direction Y.

In some embodiments, a width W3 of the upper surface BP1_US of the first lower pattern BP1 in the second direction Y may be greater than a width W4 of the upper surface BP2_US of the second lower pattern BP2 in the second direction Y. However, the technical idea of the present disclosure is not limited thereto. The width W3 of the upper surface BP1_US of the first lower pattern BP1 in the second direction Y may be the same as the width W4 of the upper surface BP2_US of the second lower pattern BP2 in the second direction Y.

Figure 6:
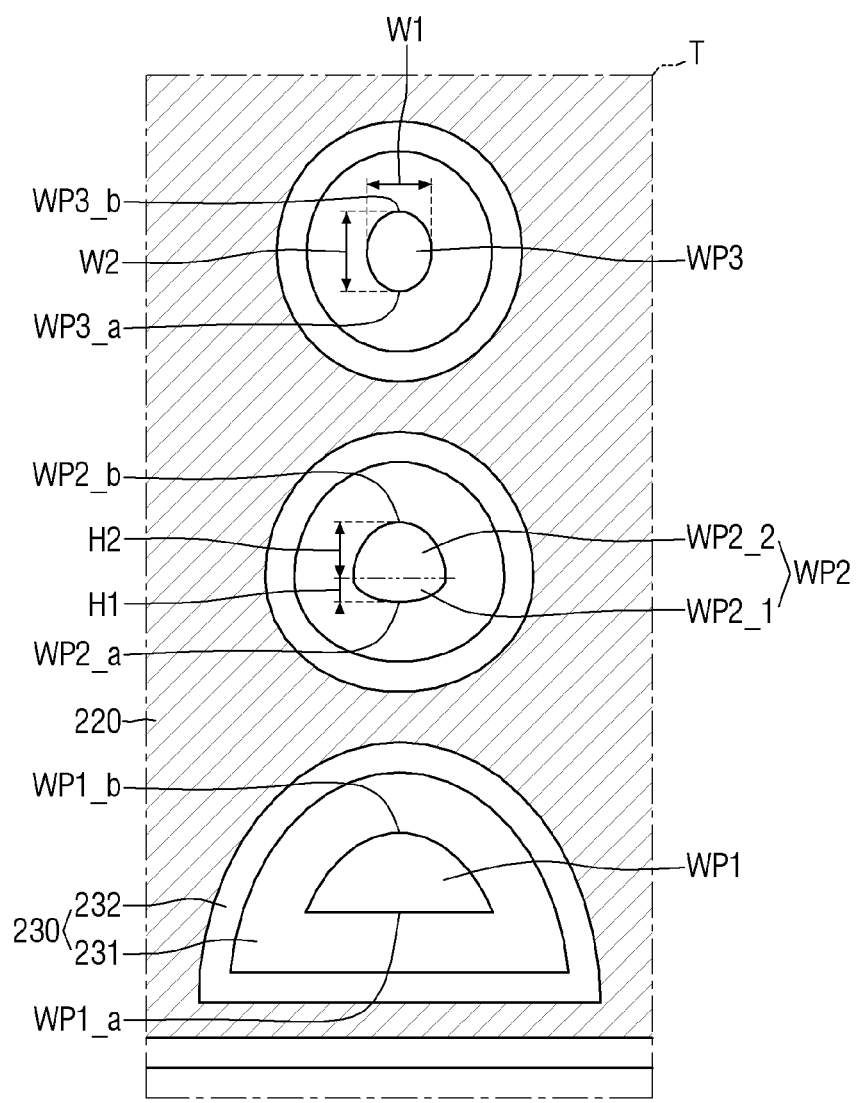
FIG. 6 is an enlarged view of region T of FIG. 5.

FIG. 6 is an enlarged view of a region T of FIG. 5. Hereinafter, the wire pattern will be described in more detail referring to FIG. 6. Referring to FIG. 6, the wire pattern WP may include a first wire pattern WP1, a second wire pattern WP2, and a third wire pattern WP3. The first wire pattern WP1 to the third wire pattern WP3 may be placed sequentially. That is, the second wire pattern WP2 may be located between the first wire pattern WP1 and the third wire pattern WP3.

In some embodiments, the first wire pattern WP1 may have a semi-circular shape from the viewpoint of the cross-sectional area. For example, the first wire pattern WP1 may include a first surface WP1_a extending in the second direction Y, and a second surface WP1_b having a concave curved surface with respect to the first surface WP1_a on the first surface WP1_a. The second surface WP1_b may be in contact with both ends of the first surface WP1_a. The second surface WP1_b may have a concave curved surface with respect to the second lower pattern BP2. The first surface WP1_a of the first wire pattern WP1 may be, for example, a semicircular diameter. The second surface WP2_b of the first wire pattern WP1 may be, for example, a semicircular arc. From the viewpoint of the cross-sectional area, the second wire pattern WP2 may include a first sub-wire pattern WP2_1 and a second sub-wire pattern WP2_2. The second sub-wire pattern WP2_2 may be placed on the first sub-wire pattern WP2_1. The width of the first sub-wire pattern WP2_1 in the second direction Y may gradually increase as its distance from the first wire pattern WP1 increases. The width of the second sub-wire pattern WP2_2 in the second direction Y may gradually decrease as its distance from the first wire pattern WP1 increases.

The width of the first sub-wire pattern WP2_1 in the second direction Y may gradually increase as its distance from the second lower pattern BP2 increases. The width of the second sub-wire pattern WP2_2 in the second direction Y may gradually decrease as its distance from the second lower pattern BP2 increases. A height H1 of the first sub-wire pattern WP2_1 in the third direction Z may be smaller than a height H2 of the first sub-wire pattern WP2_2 in the third direction Z. However, the technical idea of the present disclosure is not limited thereto.

The second wire pattern WP2 may have a third surface WP2_a and a fourth surface WP2_b. The fourth surface WP2_b may be placed on the third surface WP2_a. The third surface WP2_a and the fourth surface WP2_b may be connected to each other. The third surface WP2_a may be a convex curved surface with respect to the first wire pattern WP1. The fourth surface WP2_b may be a concave curved surface with respect to the first wire pattern WP1. A length of the third surface WP2_a may be shorter than a length of the fourth surface WP2_b. However, the technical idea of the present disclosure is not limited thereto.

From the viewpoint of the cross-sectional area, the third wire pattern WP3 may have an elliptical shape. The third wire pattern WP3 may have an elliptical shape in which the width W1 in the second direction Y is smaller than the width W2 in the third direction Z. The third wire pattern WP3 may have a fifth surface WP3_a and a sixth surface WP3_b. The fifth surface WP3_a may be a convex curved surface with respect to the first wire pattern WP1. The sixth surface WP3_b may be a concave curved surface with respect to the first wire pattern WP1. A length of the fifth surface WP3_a may be the same as a length of the sixth surface WP3_b, but is not limited thereto.

In some embodiments, the volume of the first wire pattern WP1 may be greater than the volumes of the second wire pattern WP2 and the third wire pattern WP3. The volume of the second wire pattern WP2 may be greater than the volume of the third wire pattern WP3. However, the technical idea of the present disclosure is not limited thereto.

Figure 7:
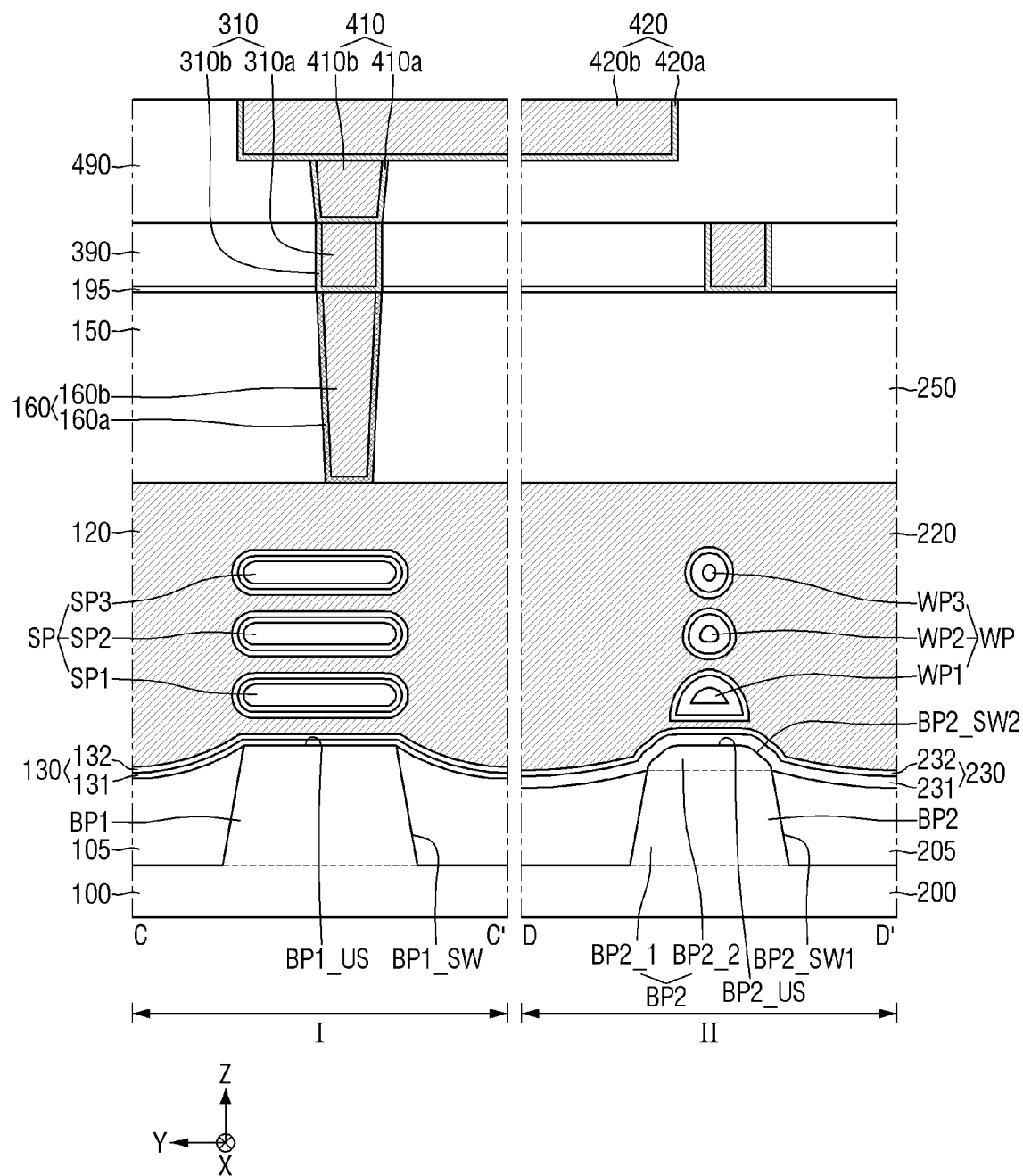
FIG. 7 is a cross-sectional diagram of a semiconductor device according to some embodiments.

FIG. 7 is a diagram for explaining the semiconductor device according to some embodiments. For convenience of explanation, points different from contents described using FIGS. 1 to 6 will be mainly described. For reference, FIG. 7 may be a cross-sectional view taken along lines C-C' and D-D' of FIG. 1. Referring to FIG. 7, the side wall BP2_SW of the second lower pattern BP2 may include a curved line.

The second lower pattern BP2 may include a first portion BP2_1 that overlaps the second field insulating film 205 in the second direction Y, and a second portion BP2_2 that does not overlap the second field insulating film 205 in the second direction Y. The side wall BP2_SW of the second lower pattern BP2 may include a side wall BP2_SW1 of the first portion BP2_1 of the second lower pattern BP2, and a side wall BP2_SW2 of the second portion BP2_2 of the second lower pattern BP2.

The side wall BP2_SW1 of the first portion BP2_1 of the second lower pattern BP2 may be a straight line. The side wall BP2_SW2 of the second portion BP2_2 of the second lower pattern BP2 may be a curved line. A slope of the side wall BP2_SW1 of the first portion BP2_1 of the second lower pattern BP2 may be different from a slope of the side wall BP2_SW2 of the second portion BP2_2 of the second lower pattern BP2. In the process of forming the wire pattern WP, a part of the second lower pattern BP2 may be removed. In the process of forming the wire pattern WP, a part of the second portion BP2_2 of the second lower pattern BP2 may be removed. However, the technical idea of the present disclosure is not limited thereto.

Figure 8:
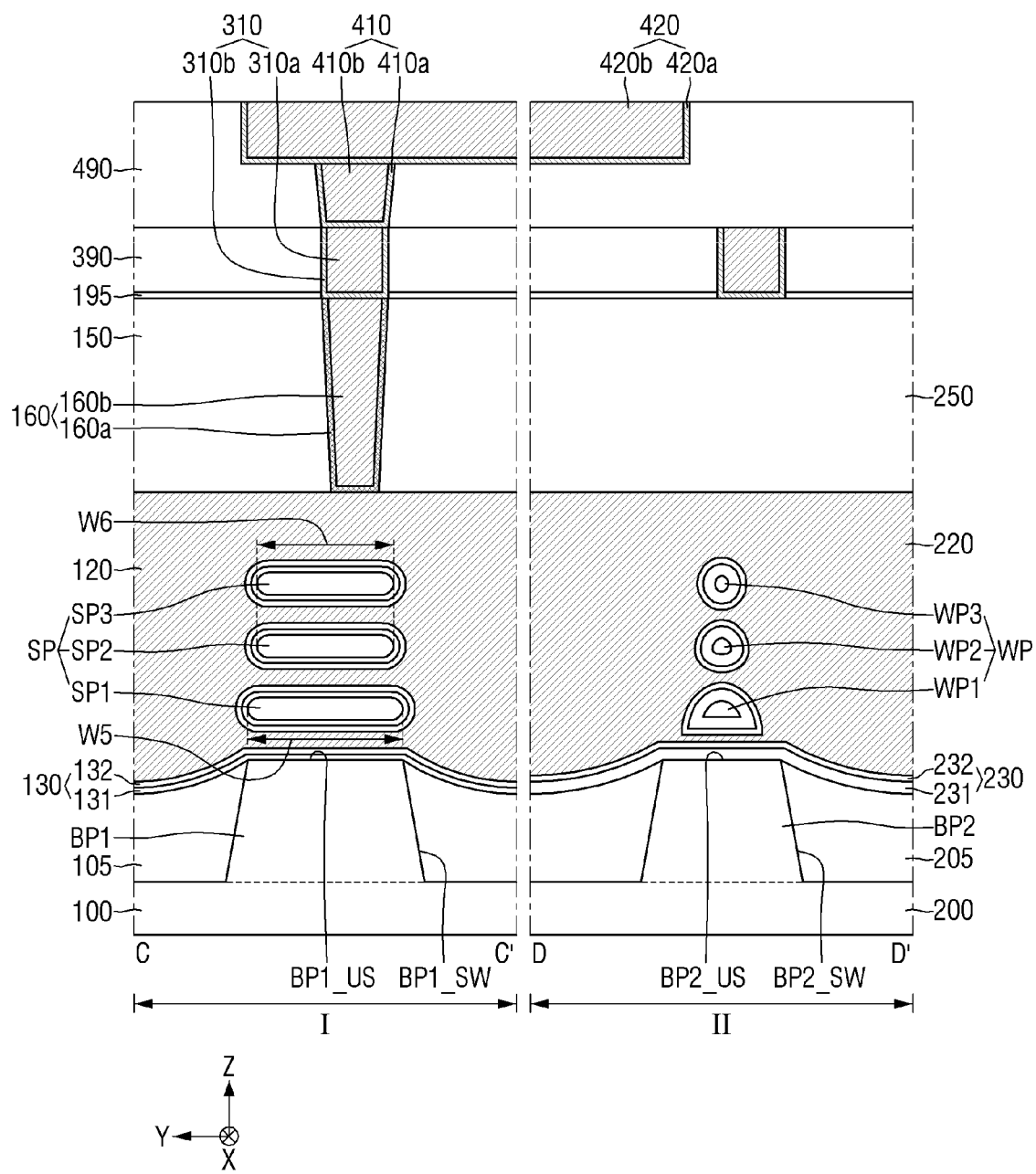
FIG. 8 is a cross-sectional diagram of a semiconductor device according to some embodiments.

FIG. 8 is a diagram for explaining a semiconductor device according to some embodiments. For convenience of explanation, points different from contents described using FIGS. 1 to 6 will be mainly described. For reference, FIG. 8 may be a cross-sectional view taken along lines C-C' and D-D' of FIG. 1. Referring to FIG. 8, a width W5 of the first sheet pattern SP1 in the second direction Y may be different from a width W6 of the second sheet pattern SP2 and the third sheet pattern SP3 in the second direction Y. The width W6 of the second sheet pattern SP2 in the second direction Y may be the same as the width W6 of the third sheet pattern SP3 in the second direction Y. On the other hand, the width W5 of the first sheet pattern SP1 in the second direction Y may be greater than the width W6 of the second sheet pattern SP2 and the third sheet pattern SP3 in the second direction Y.

Figure 9:
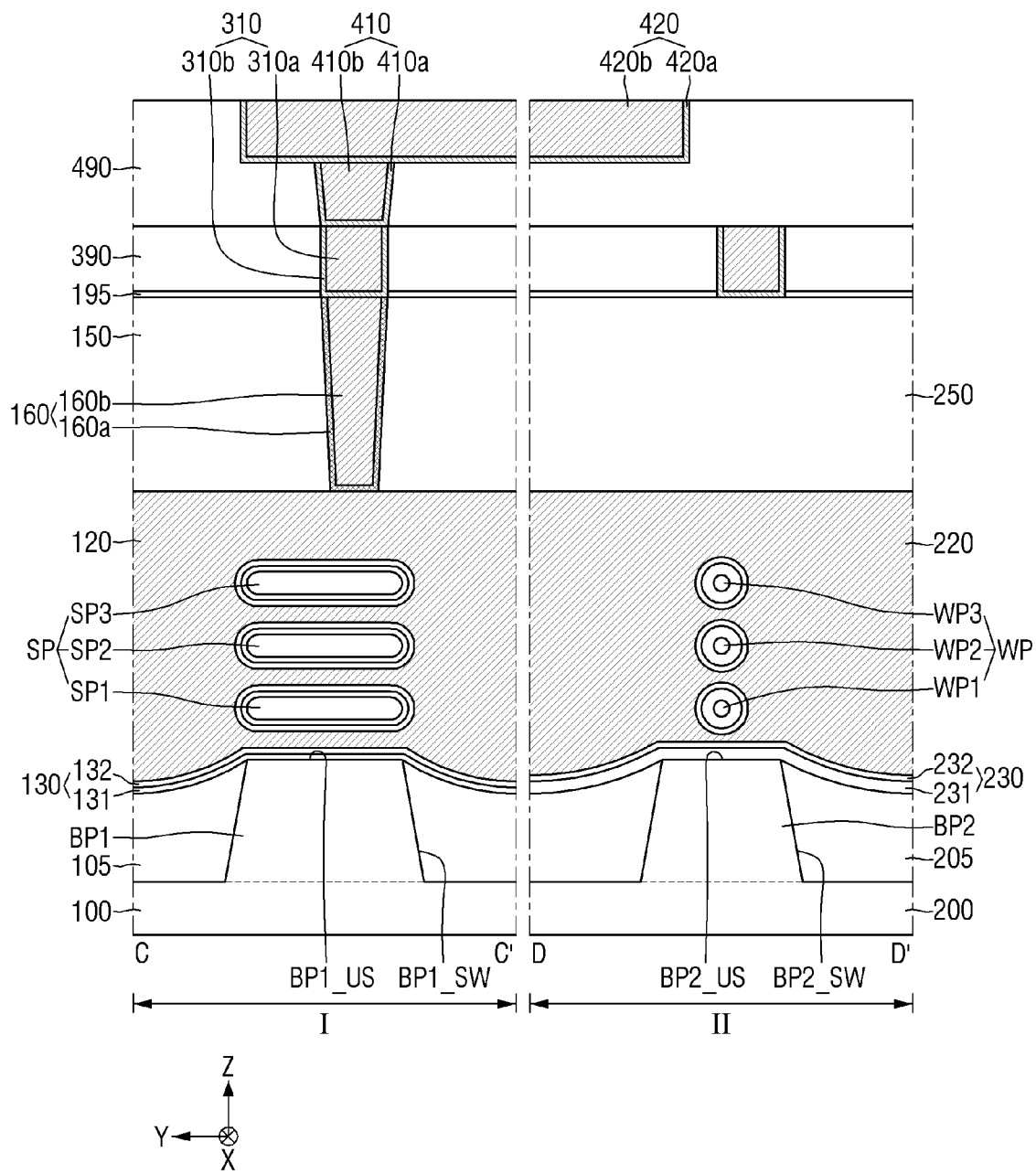
FIG. 9 is a cross-sectional diagram of a semiconductor device according to some embodiments.

FIG. 9 is a diagram for explaining a semiconductor device according to some embodiments. For convenience of explanation, points different from contents described using FIGS. 1 to 6 will be mainly described. For reference, FIG. 9 may be a cross-sectional view taken along lines C-C' and D-D' of FIG. 1. Referring to FIG. 9, the first to third wire patterns WP1 to WP3 according to some embodiments may all have the same shape. Each of the first to third wire patterns WP1 to WP3 may all have, for example, a circular shape. The volumes of each of the first to third wire patterns WP1 to WP3 may all be the same. However, the technical idea of the present disclosure is not limited thereto. The first to third wire patterns WP1 to WP3 may, of course, have an elliptical shape.

Figure 10:
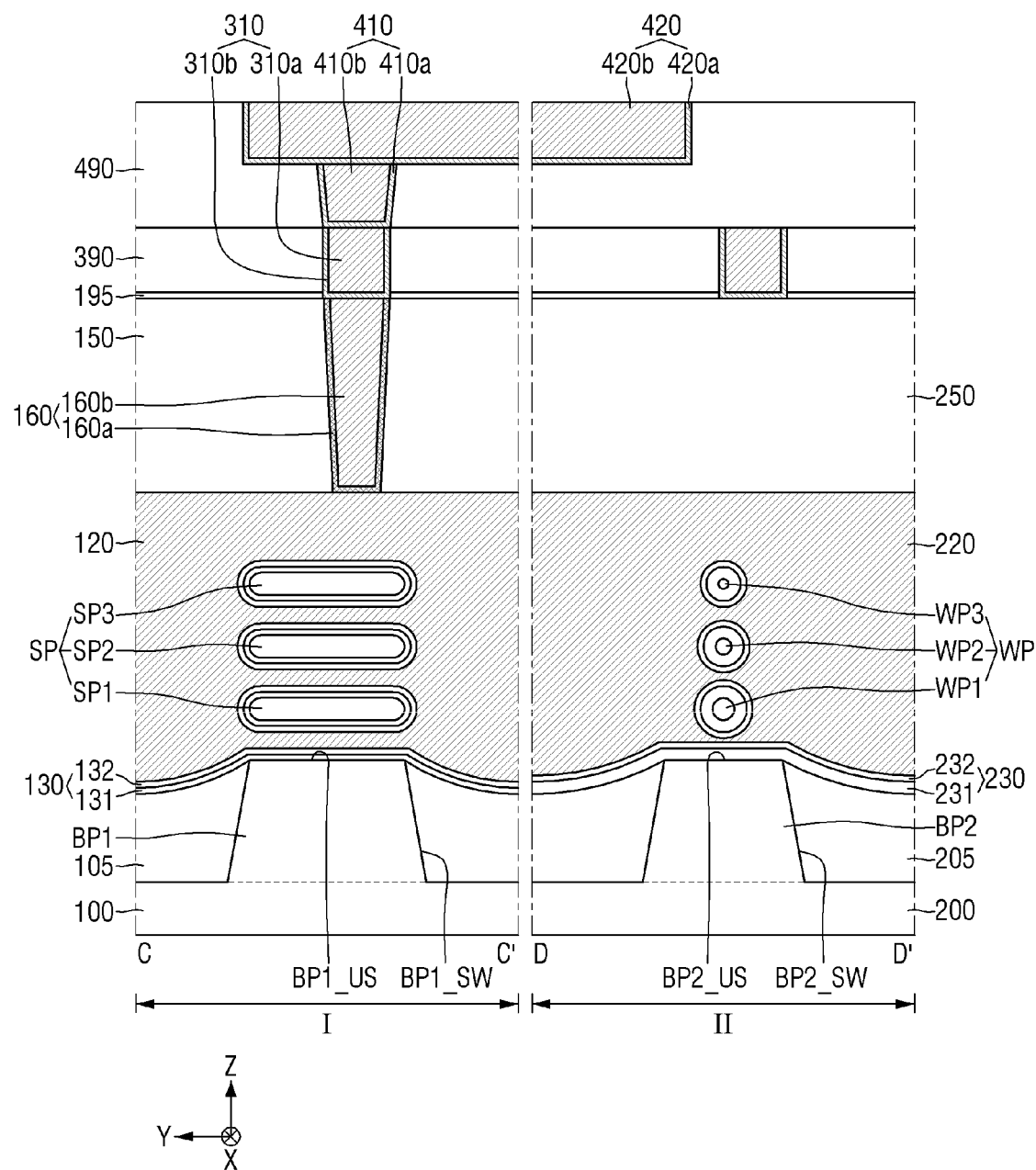
FIG. 10 is a cross-sectional diagram of a semiconductor device according to some embodiments.

FIG. 10 is a diagram for explaining the semiconductor device according to some embodiments. For convenience of explanation, points different from contents described using FIGS. 1 to 6 and 9 will be mainly described. For reference, FIG. 10 may be a cross-sectional view taken along lines C-C' and D-D' of FIG. 1.

Referring to FIG. 10, the wire pattern WP according to some embodiments may have different sizes. For example, from the viewpoint of the cross-sectional area, the size of the first wire pattern WP1 may be greater than the sizes of the second wire pattern WP2 and the third wire pattern WP3. The size of the second wire pattern WP2 may be greater than the size of the third wire pattern WP3. That is, the size of the wire pattern WP may gradually decrease as its distance from the second lower pattern BP2 increases. In some embodiments, the volume of the first wire pattern WP1 may be greater than the volumes of the second wire pattern WP2 and the third wire pattern WP3. The volume of the second wire pattern WP2 may be greater than the volume of the third wire pattern WP3.

Figure 11:
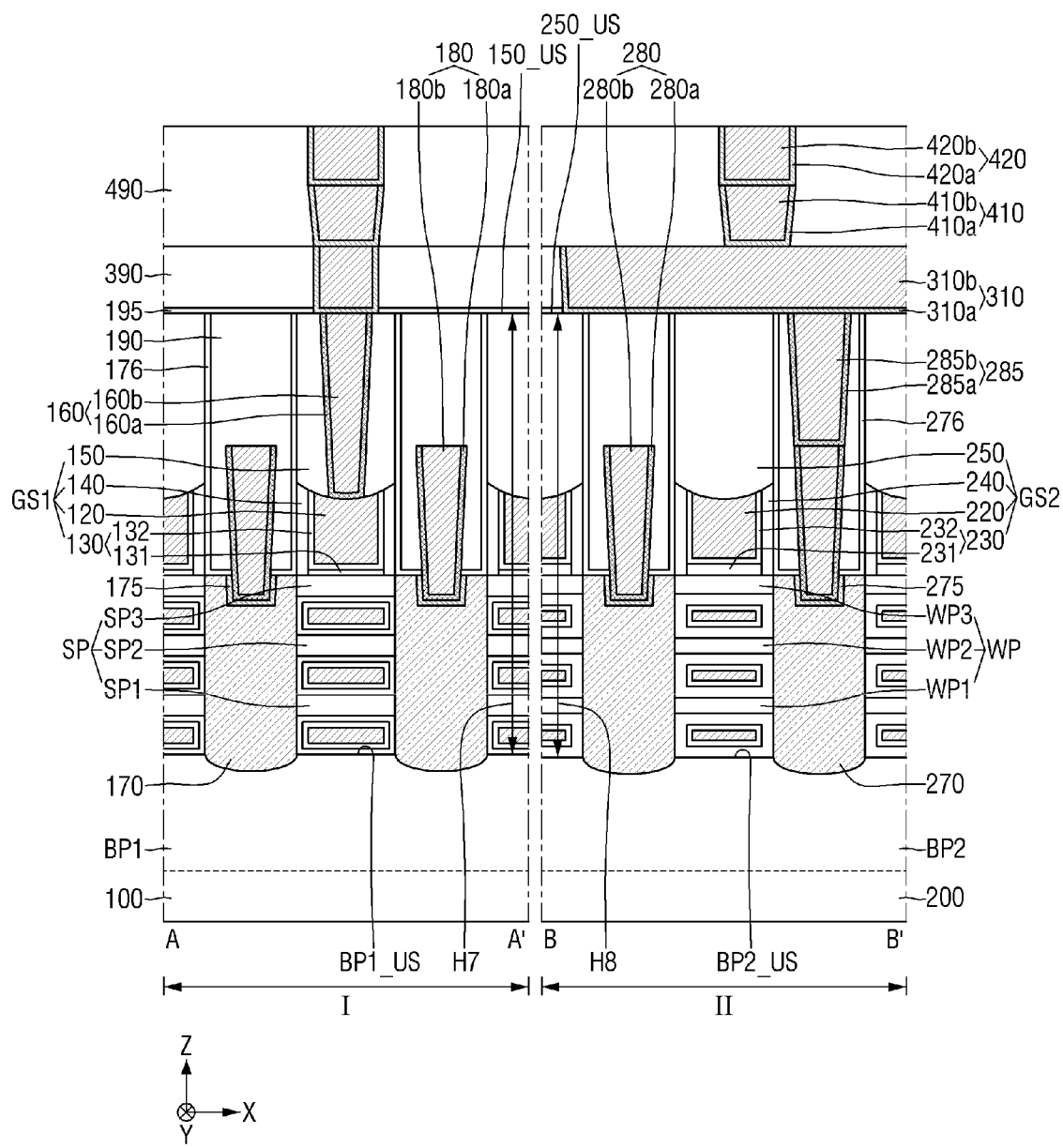
FIG. 11 is a cross-sectional diagram of a semiconductor device according to some embodiments.
Figure 12:
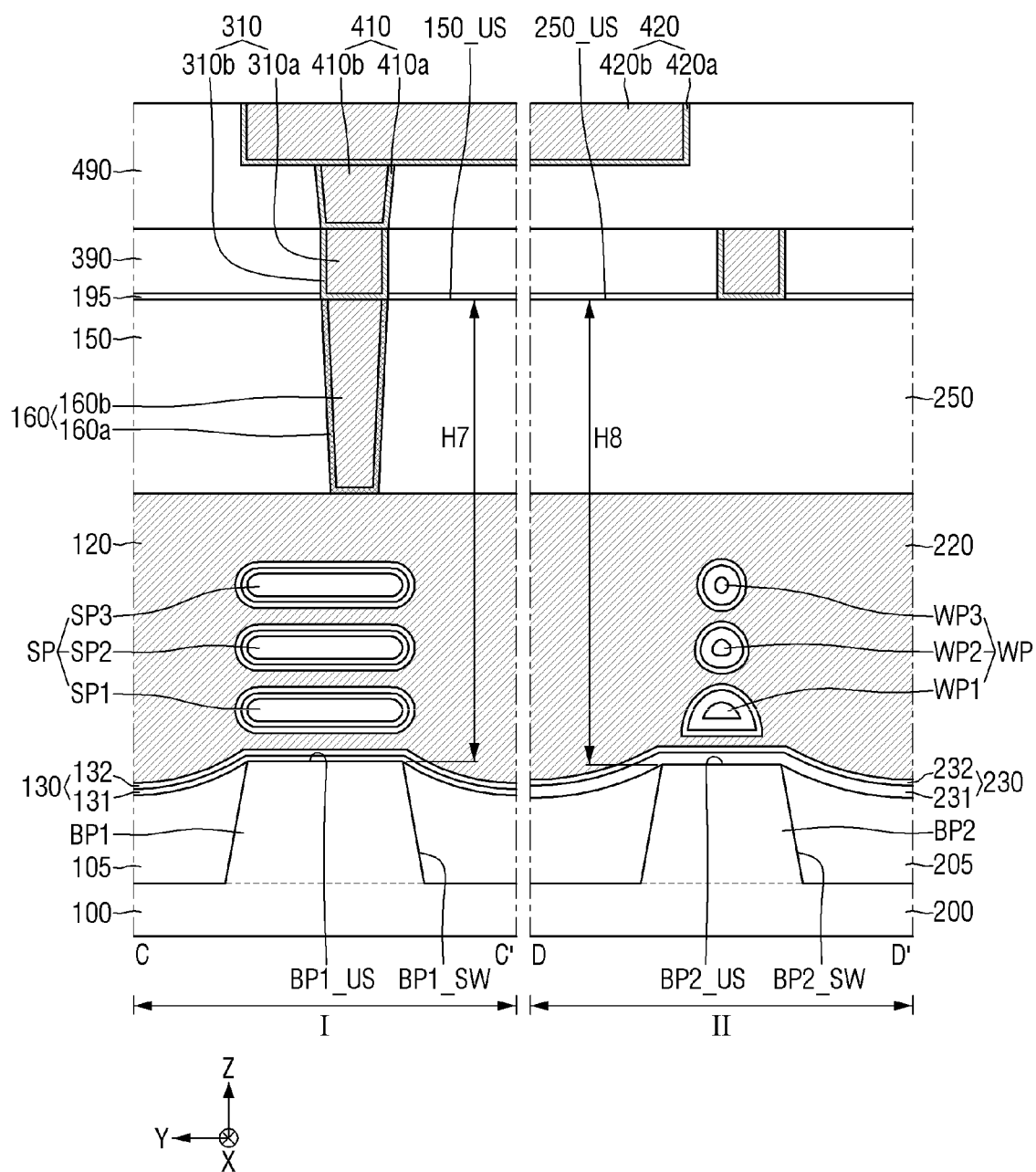
FIG. 12 is a cross-sectional diagram of a semiconductor device according to some embodiments.

FIG. 11 is a diagram for explaining a semiconductor device according to some embodiments. FIG. 12 is a diagram for explaining a semiconductor device according to some embodiments. For convenience of explanation, points different from contents described using FIGS. 1 to 6 will be mainly described. For reference, FIG. 11 may be a cross-sectional view taken along lines A-A' and B-B' of FIG. 1. FIG. 12 may be a cross-sectional view taken along lines C-C' and D-D' of FIG. 1.

Referring to FIG. 11 and FIG. 12, the upper surface BP1_US of the first lower pattern BP1 and the upper surface BP2_US of the second lower pattern BP_2 may not be located in the same plane. The upper surface BP1_US of the first lower pattern BP1 may be formed to be higher than the upper surface BP2_US of the second lower pattern BP_2. As an example, a height H7 from the upper surface 150_US of the first gate capping pattern 150 to the upper surface BP1_US of the first lower pattern BP1 may be smaller than a height H8 from the upper surface 250_US of the second gate capping pattern 250 to the upper surface BP2_US of the second lower pattern BP2. The upper surface 150_US of the first gate capping pattern 150 may be located in the same plane as the upper surface 250_US of the second gate capping pattern 250. Accordingly, the upper surface 150_US of the first gate capping pattern 150 may be higher than the upper surface BP2_US of the second lower pattern BP2.

The height from the upper surface of the first substrate 100 to the upper surface BP1_US of the first lower pattern BP1 may be greater than the height from the upper surface of the second substrate 200 to the upper surface BP2_US of the second lower pattern BP_2. A height of the first lower pattern BP1 in the third direction Z may be greater than the height of the second lower pattern BP2 in the third direction Z. In the process of forming the wire pattern WP, a part of the second lower pattern BP2 is removed, and the upper surface BP2_US of the second lower pattern BP2 may be lowered.

Figure 13:
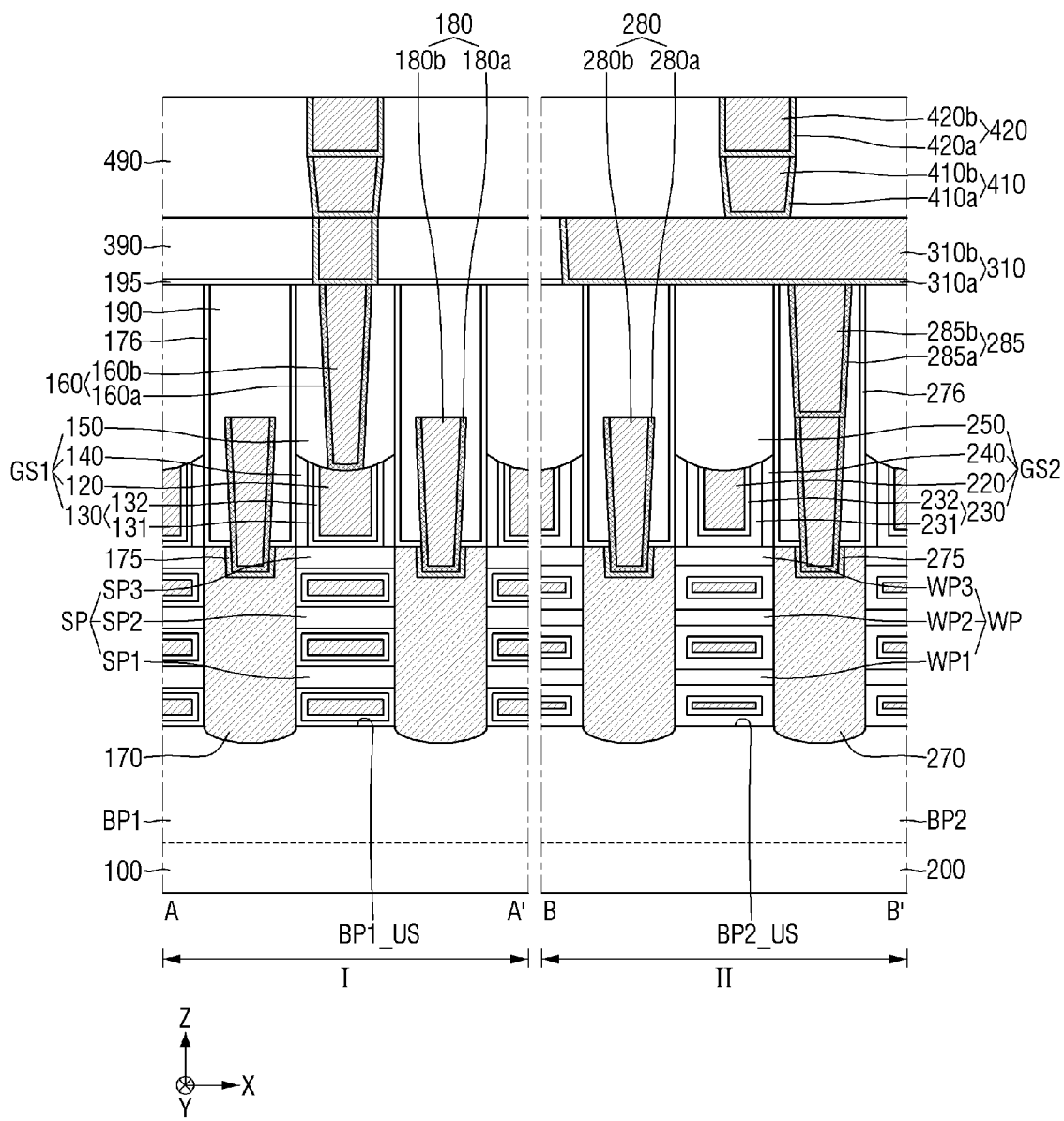
FIG. 13 is a cross-sectional diagram of a semiconductor device according to some embodiments.

FIG. 13 is a diagram for explaining a semiconductor device according to some embodiments. For convenience of explanation, points different from contents described using FIGS. 1 to 6 will be mainly described. For reference, FIG. 13 may be a cross-sectional view taken along lines A-A' and B-B' of FIG. 1. Referring to FIG. 13, a first interface film 131 on the sheet pattern SP may be placed in a 'U' shape. A second interface film 231 on the wire pattern WP may be placed in a 'U' shape. The first interface film 131 may be placed on the side wall of the first gate spacer 140. The first interface film 131 may be placed between the side wall of the first gate spacer 140 and the first high dielectric constant film 132. The second interface film 231 may be placed on the side wall of the second gate spacer 240. The second interface film 231 may be placed between the side wall of the second gate spacer 240 and the second high dielectric constant film 232.

Figure 14:
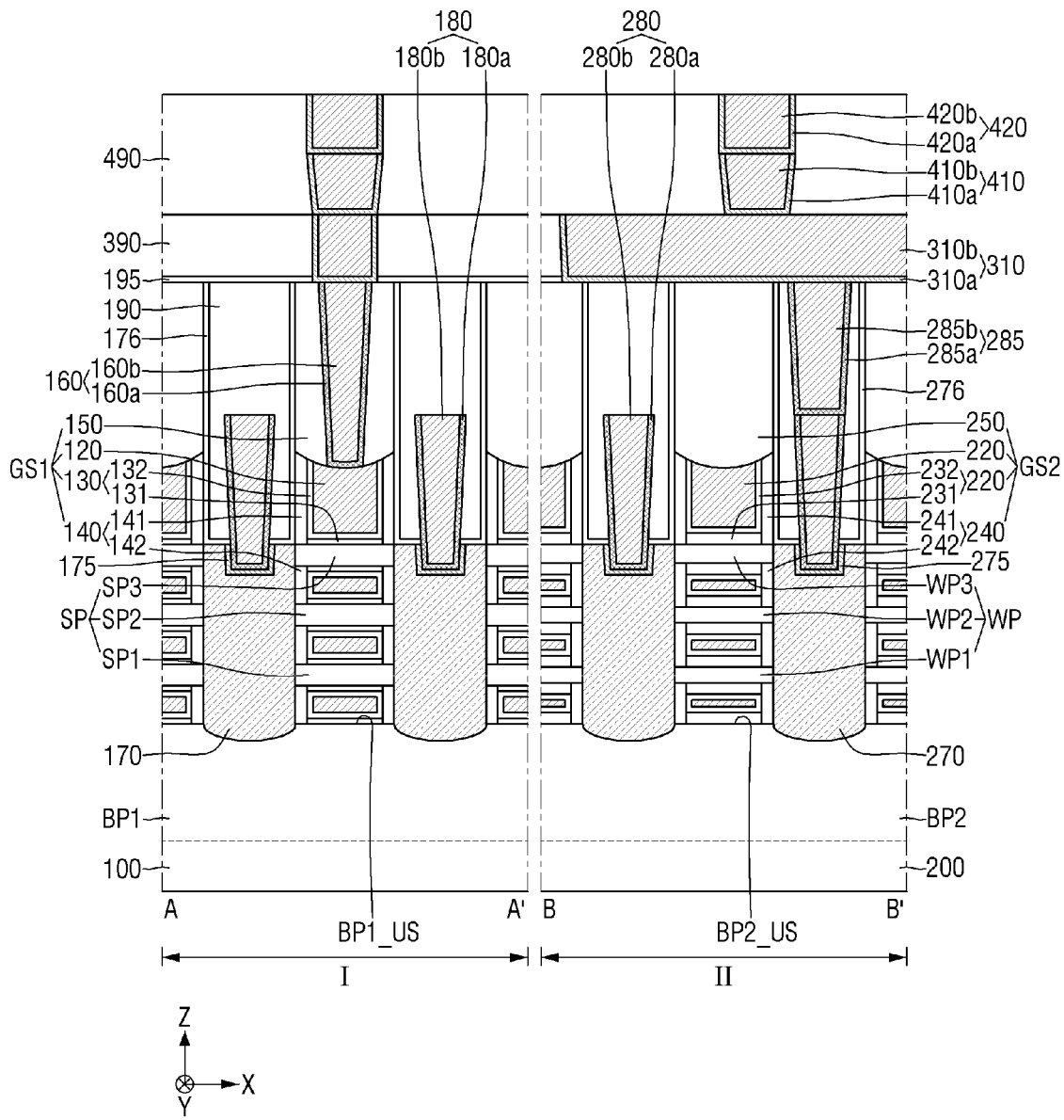
FIG. 14 is a cross-sectional diagram of a semiconductor device according to some embodiments.

FIG. 14 is a diagram for explaining a semiconductor device according to some embodiments. For convenience of explanation, points different from contents described using FIGS. 1 to 6 will be mainly described. For reference, FIG. 14 may be a cross-sectional view taken along lines A-A' and B-B' of FIG. 1. Referring to FIG. 14, the first gate spacer 140 may include a first outer spacer 141 and a first inner spacer 142. The second gate spacer 240 may include a second outer spacer 241 and a second inner spacer 242.

The first inner spacer 142 may be placed between the first source/drain patterns 170. The second inner spacer 242 may be placed between the second source/drain patterns 270. The first inner spacer 142 and the second inner spacer 242 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

The first interface film 131 may not extend along the side wall of the first inner spacer 142 between the first source/drain patterns 170. The first interface film 131 may be placed between the sheet pattern SP and the first high dielectric constant film 132, or between the first lower pattern BP1 and the first high dielectric constant film 132. The second interface film 231 may not extend along the side wall of the second inner spacer 242 between the second source/drain patterns 270. The second interface film 231 may be placed between the wire pattern WP and the second high dielectric constant film 232, or between the second lower pattern BP2 and the second high dielectric constant film 232.

Figure 15:
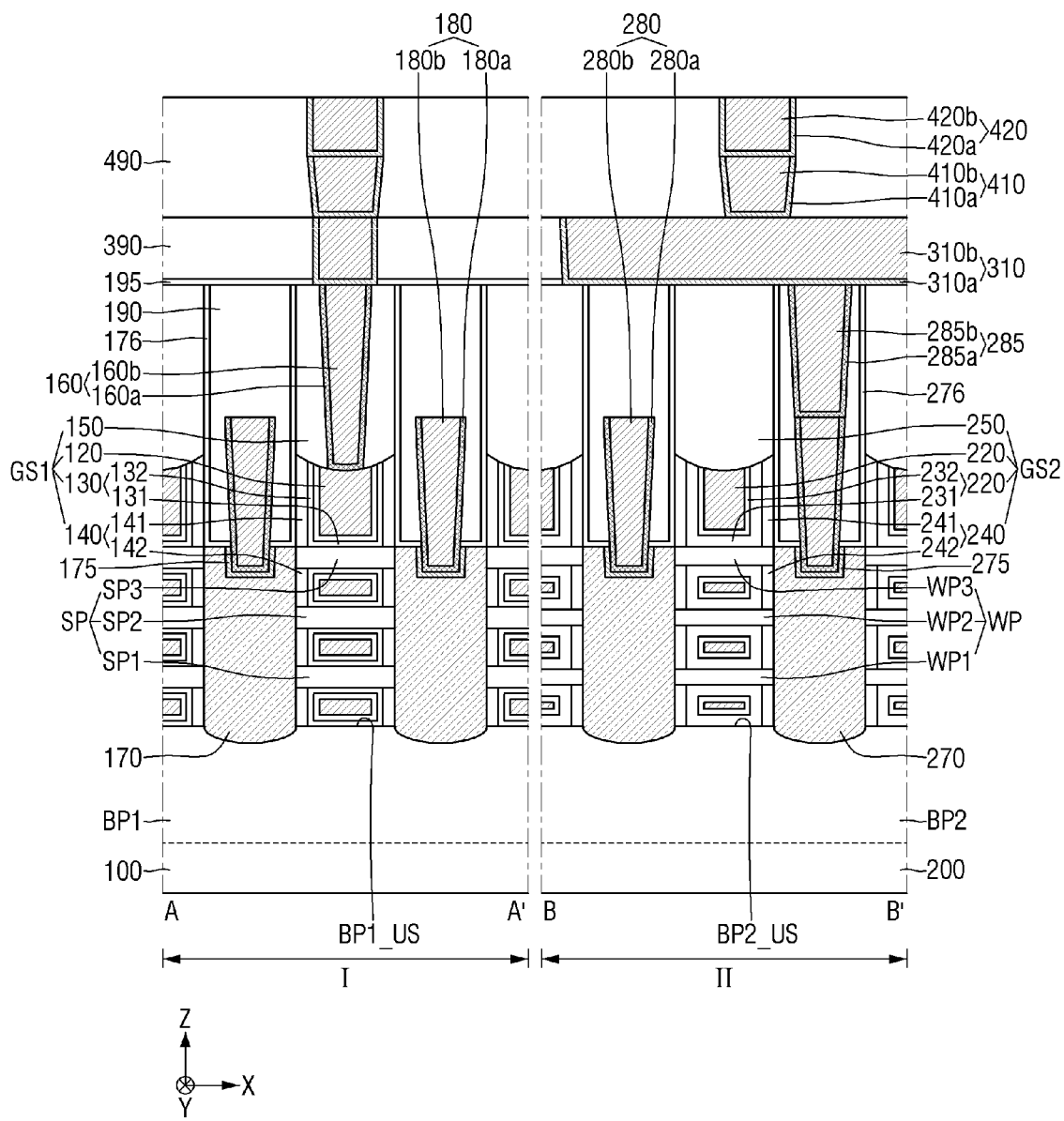
FIG. 15 is a cross-sectional diagram of a semiconductor device according to some embodiments.

FIG. 15 is a diagram for explaining a semiconductor device according to some embodiments. For convenience of explanation, points different from contents described using FIGS. 1 to 6 and 14 will be mainly described. For reference, FIG. 15 may be a cross-sectional view taken along lines A-A' and B-B' of FIG. 1. Referring to FIG. 15, the first interface film 131 on the sheet pattern SP may be placed in a 'U' shape. The second interface film 231 on the wire pattern WP may be placed in a CU' shape.

The first interface film 131 may be placed on the side wall of the first outer spacer 141. The first interface film 131 may extend along the side walls of the sheet pattern SP and the first outer spacer 141. The first interface film 131 may be placed on the side wall of the first inner spacer 142. The first interface film 131 may wrap around the first high dielectric constant film 132.

The second interface film 231 may be placed on the side wall of the second outer spacer 241. The second interface film 231 may extend along the side walls of the wire pattern WP and the second outer spacer 241. The second interface film 231 may be placed on the side wall of the second inner spacer 242. The second interface film 231 may wrap around the second high dielectric constant film 232.

Figure 16:
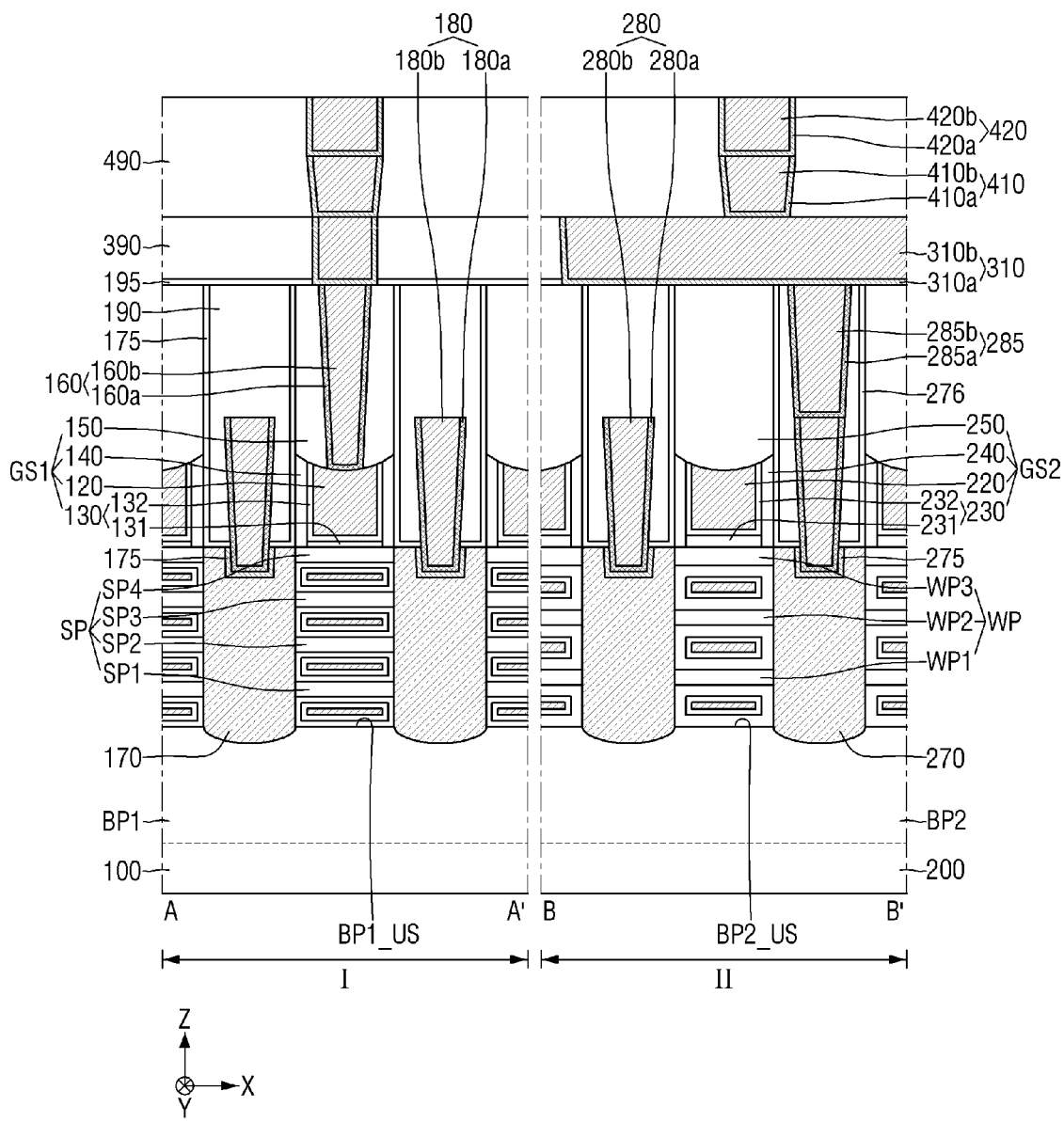
FIG. 16 is a cross-sectional diagram of a semiconductor device according to some embodiments.
Figure 17:
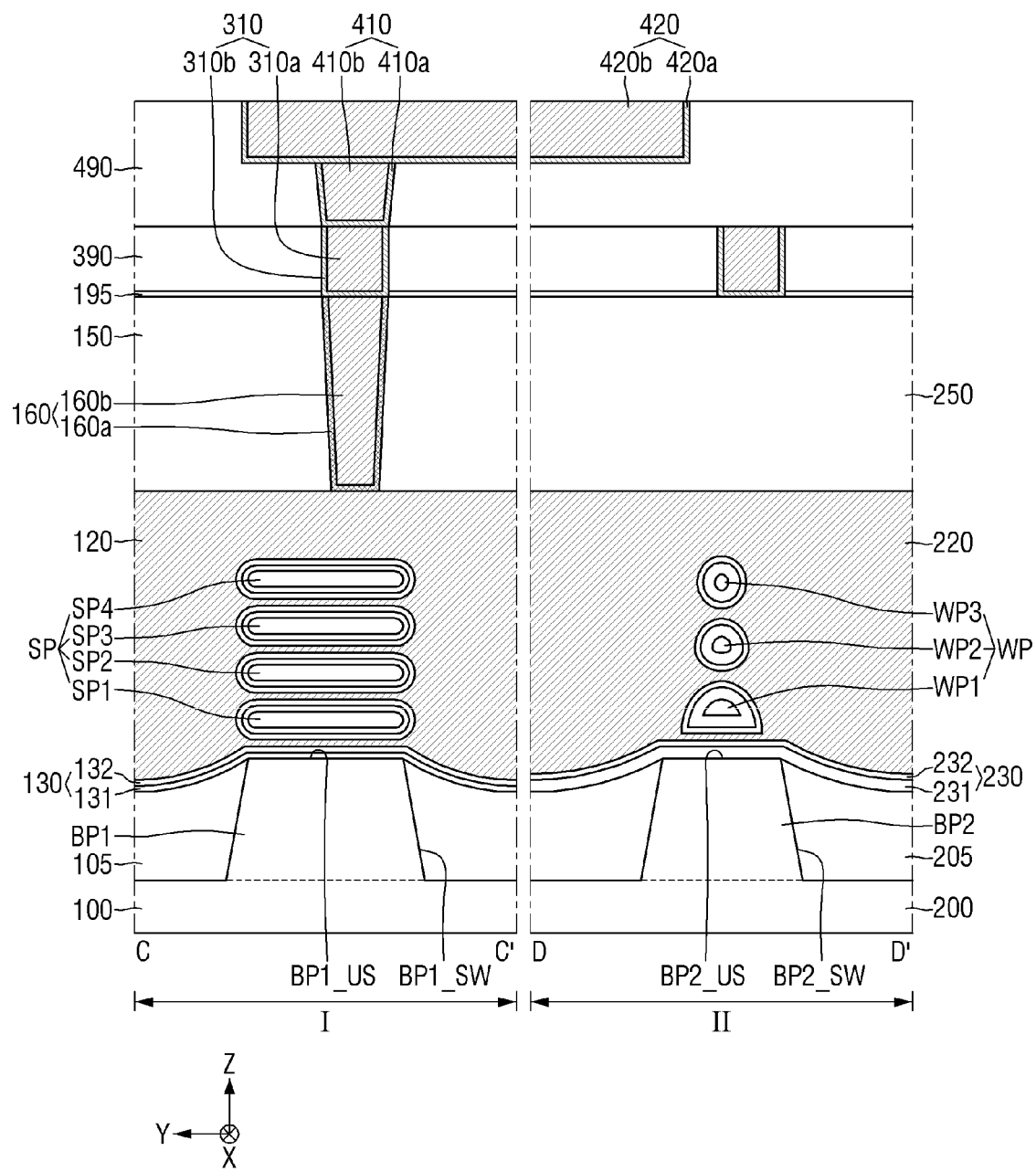
FIG. 17 is a cross-sectional diagram of a semiconductor device according to some embodiments.

FIG. 16 is a diagram for explaining a semiconductor device according to some embodiments. FIG. 17 is a diagram for explaining a semiconductor device according to some embodiments. For convenience of explanation, points different from contents described using FIGS. 1 to 6 will be mainly described. For reference, FIG. 16 may be a cross-sectional view taken along lines A-A' and B-B' of FIG. 1. FIG. 17 may be a cross-sectional view taken along lines C-C' and D-D' of FIG. 1.

Referring to FIGS. 16 and 17, the number of sheet patterns SP may be greater than the number of wire patterns WP. The sheet patterns SP may include a first sheet pattern SP1, a second sheet pattern SP2, a third sheet pattern SP3, and a fourth sheet pattern SP4 which are sequentially placed on the first lower pattern BP1. The first sheet pattern SP1 may be located between the first lower pattern BP1 and the second sheet pattern SP2. The second sheet pattern SP2 may be located between the third sheet pattern SP3 and the first sheet pattern SP1. The third sheet pattern SP3 may be located between the fourth sheet pattern SP4 and the second sheet pattern SP2. Moreover, although the number of sheet patterns SP is shown as four, and the number of wire patterns WP is shown as three, this is only for convenience of explanation, and the numbers thereof are not limited thereto.

Figure 18:
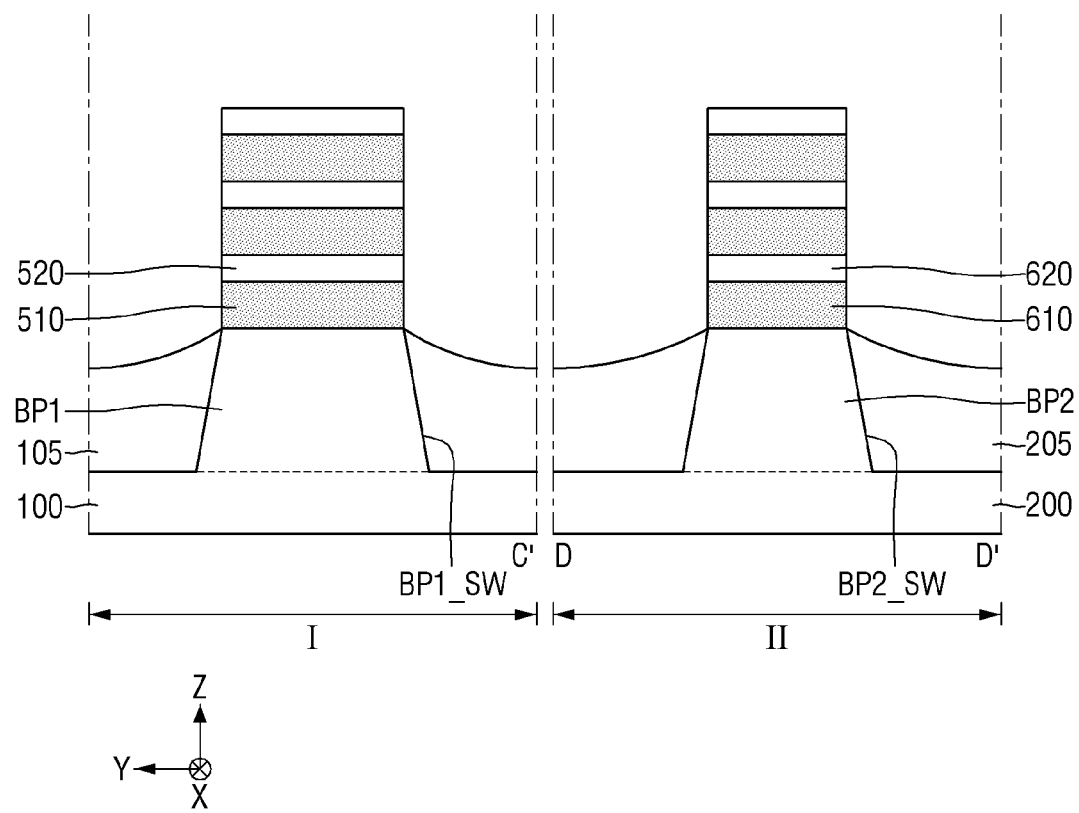
FIGS. 18 to 33 are cross-sectional views of intermediate structures that illustrate methods of fabricating semiconductor devices according to some embodiments of the present disclosure.

FIGS. 18 to 33 are cross-sectional views of intermediate structures that illustrate methods of fabricating semiconductor devices according to some embodiments of the present disclosure. Referring to FIG. 18, a first lower pattern BP1 may be formed on the first substrate 100 of the first region I. A first field insulating film 105 may be formed on both sides of the first lower pattern BP1. A first mold film 510 and a pre-sheet pattern 520 may be sequentially stacked on the first lower pattern BP1. Although the numbers of first mold films 510 and pre-sheet patterns 520 are shown as three, this is only for convenience of explanation, and the numbers thereof are not limited thereto.

A second lower pattern BP2 may be formed on the second substrate 200 of the second region II. A second field insulating film 205 may be formed on both sides of the second lower pattern BP2. A second mold film 610 and a pre-wire pattern 620 may be sequentially stacked on the second lower pattern BP2. Although the numbers of second mold films 610 and pre-wire patterns 620 are shown as three, this is only for convenience of explanation, and the numbers thereof are not limited thereto.

In some embodiments, the thickness of the first mold film 510 and the second mold film 610 may be, for example, 10 nm to 50 nm. The first mold film 510 and the second mold film 610 may be formed at the same level. The pre-sheet pattern 520 and the pre-wire pattern 620 may be formed at the same level. However, the technical idea of the present disclosure is not limited thereto. Of course, the thickness of the first mold film 510 and the thickness of the second mold film 610 may be different from each other. Although the thicknesses of the first mold film 510 and the second mold film 610 are shown as being different from the thicknesses of the pre-sheet pattern 520 and the pre-wire pattern 620, this is only for convenience of explanation, and the embodiment is not limited thereto. The thicknesses of the first mold film 510 and the second mold film 610 may be the same as the thicknesses of the pre-sheet pattern 520 and the pre-wire pattern 620.

The first mold film 510 and the second mold film 610 may include, for example, silicon germanium (SiGe). The pre-sheet pattern 520 and the pre-wire pattern 620 may include, for example, silicon (Si). In some embodiments, the concentration of germanium (Ge) included in the first mold film 510 and the second mold film 610 may be 10% to 90%. The concentration of germanium (Ge) included in the first mold film 510 may be the same as the concentration of germanium (Ge) included in the second mold film 610. However, the technical idea of the present disclosure is not limited thereto. The concentration of germanium (Ge) included in the first mold film 510 may, of course, differ from the concentration of germanium (Ge) included in the second mold film 610.

Figure 19:
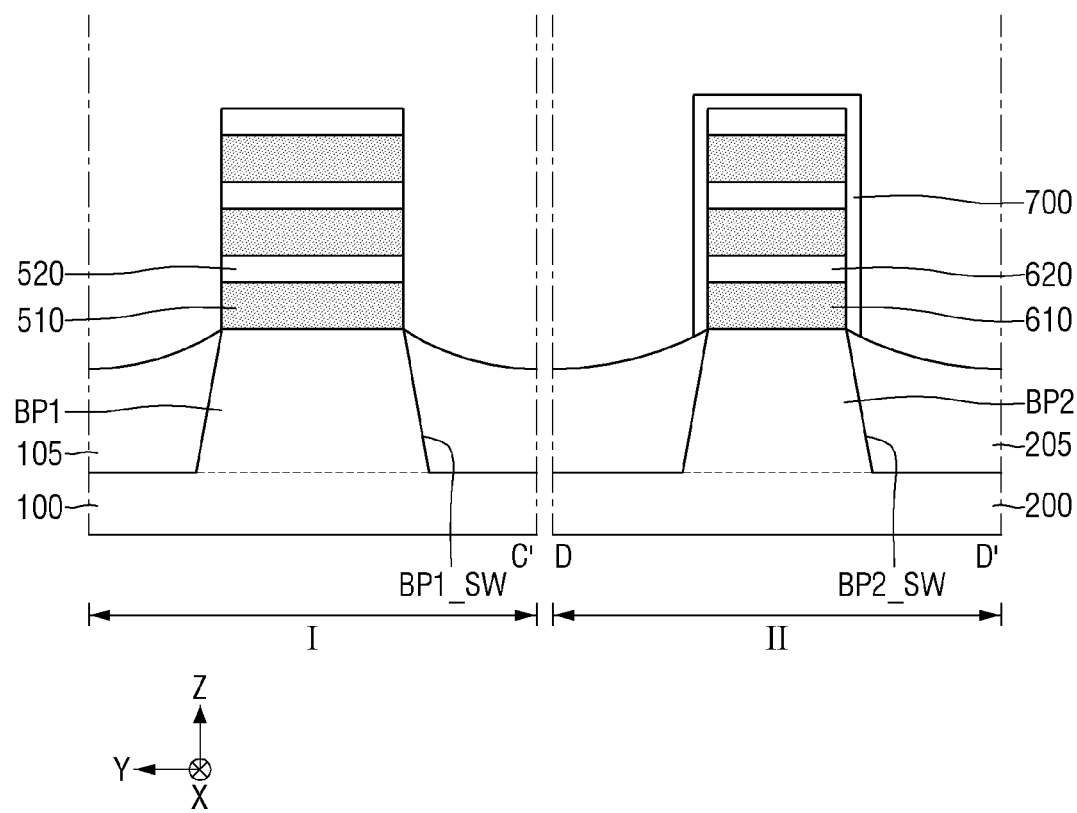

Referring to FIG. 19, in the second region II, a protective film 700 may be formed on the side wall of the second mold film 610, the side wall of the pre-wire pattern 620, and the upper surface of the pre-wire pattern 620. The protective film 700 may protect the pre-wire pattern 620 when the sheet pattern is formed. The protective film 700 may include, for example, but is not limited to, silicon (Si).

Figure 20:
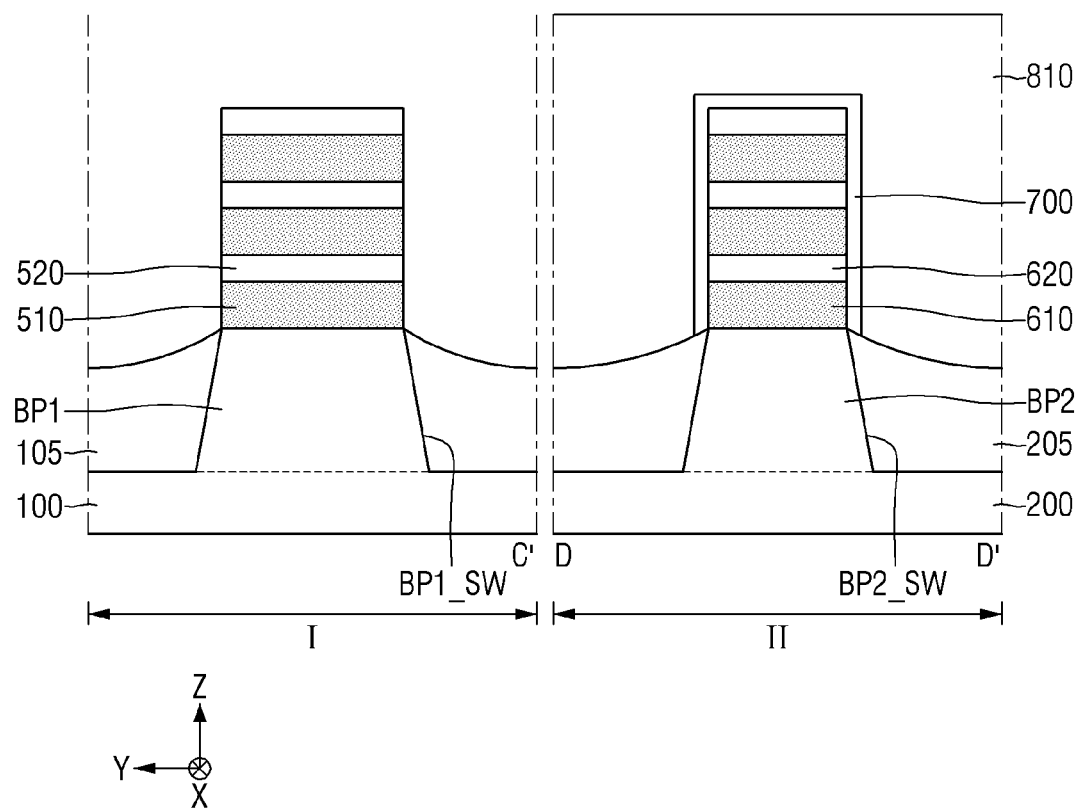

Referring to FIG. 20, in the second region II, a first sacrificial film 810 may be formed on the second field insulating film 205 and the protective film 700. The first sacrificial film 810 may protect the pre-wire pattern 620 when the sheet pattern is formed. The first sacrificial film 810 may include, for example, but is not limited to, silicon oxide. Unlike the shown example, the first sacrificial film 810 may not be formed.

Figure 21:
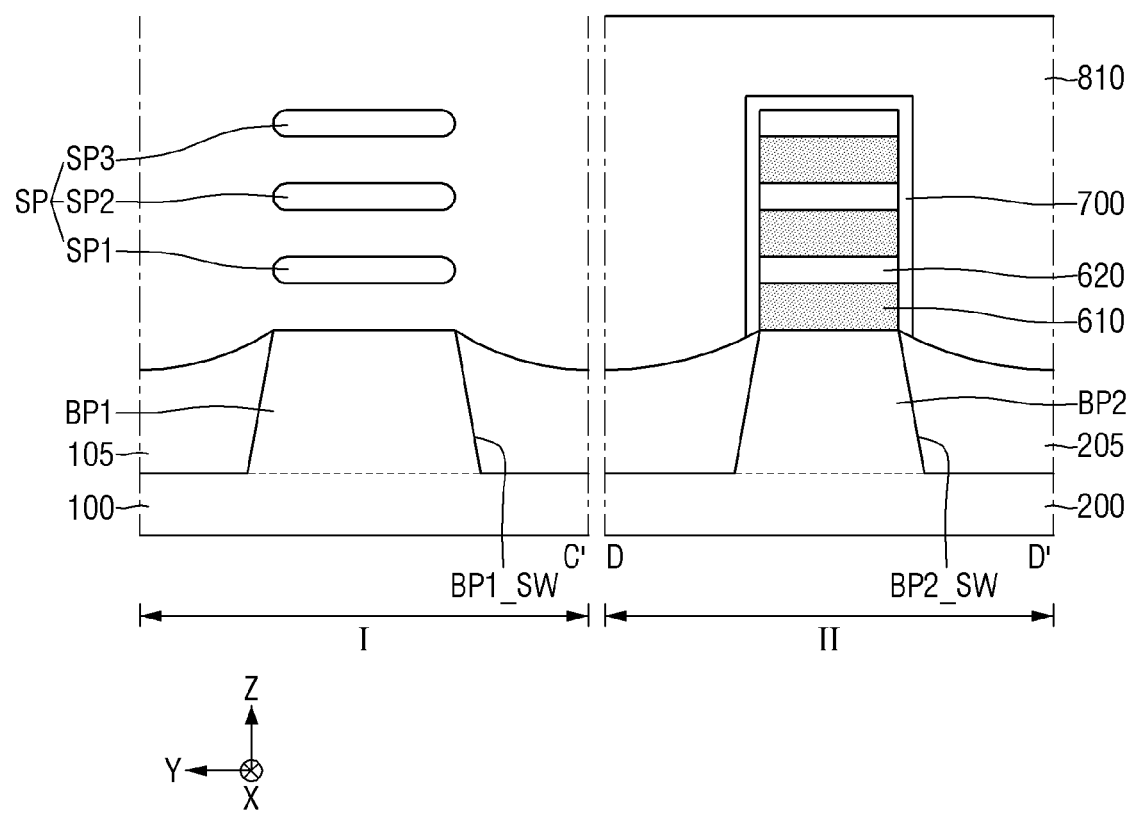

Referring to FIG. 21, the sheet pattern SP may be formed by removing the first mold film 510. The first mold film 510 may be selectively removed by utilizing the process of selectively removing silicon germanium. That is, silicon germanium may be removed, but silicon may not be removed.

In some embodiments, the sheet pattern closest to the first lower pattern BP1 may be the first sheet pattern SP1. The second sheet pattern SP2 may be formed on the first sheet pattern SP1. The second sheet pattern SP2 may be spaced apart from the first sheet pattern SP1 in the third direction Z. The third sheet pattern SP3 may be formed on the second sheet pattern SP2. The third sheet pattern SP3 may be spaced apart from the second sheet pattern SP2 in the third direction Z.

Figure 22:
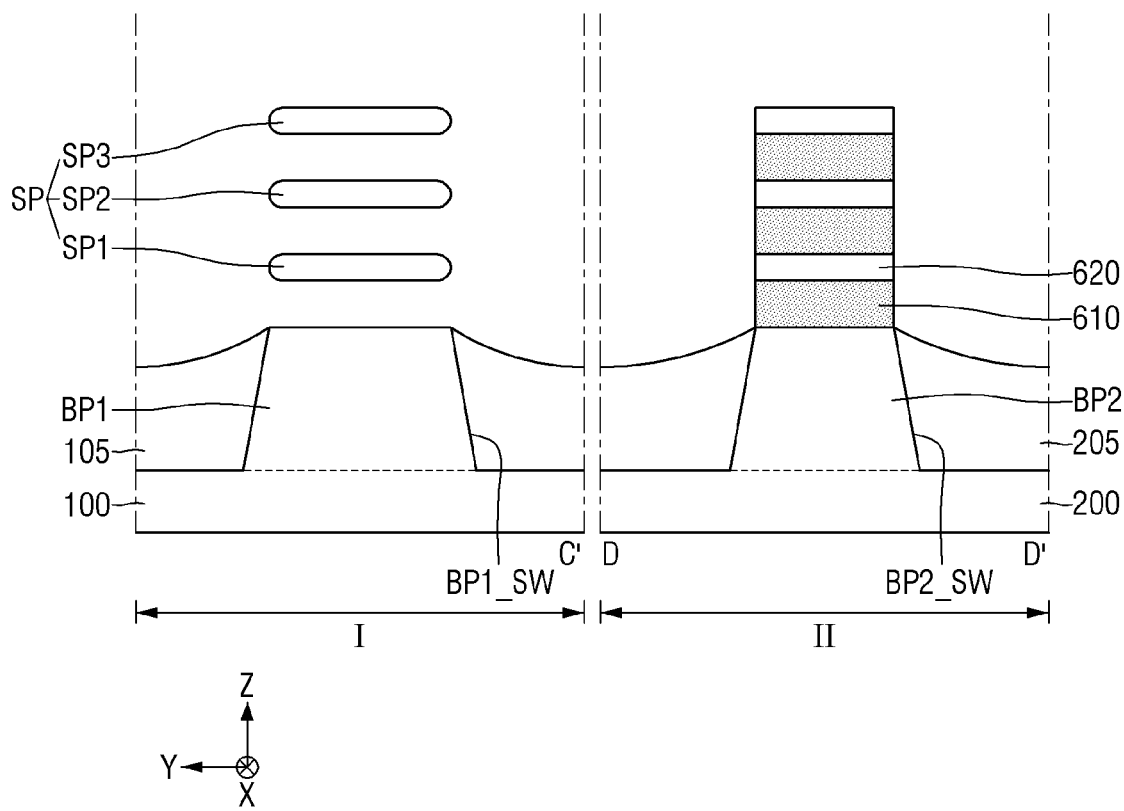

Referring to FIG. 22, the protective film 700 and the first sacrificial film 810 may be removed. The first sacrificial film 810 may be removed to expose the protective film 700. Subsequently, the protective film 700 may be removed to expose the second mold film 610 and the pre-wire pattern 620.

Figure 23:
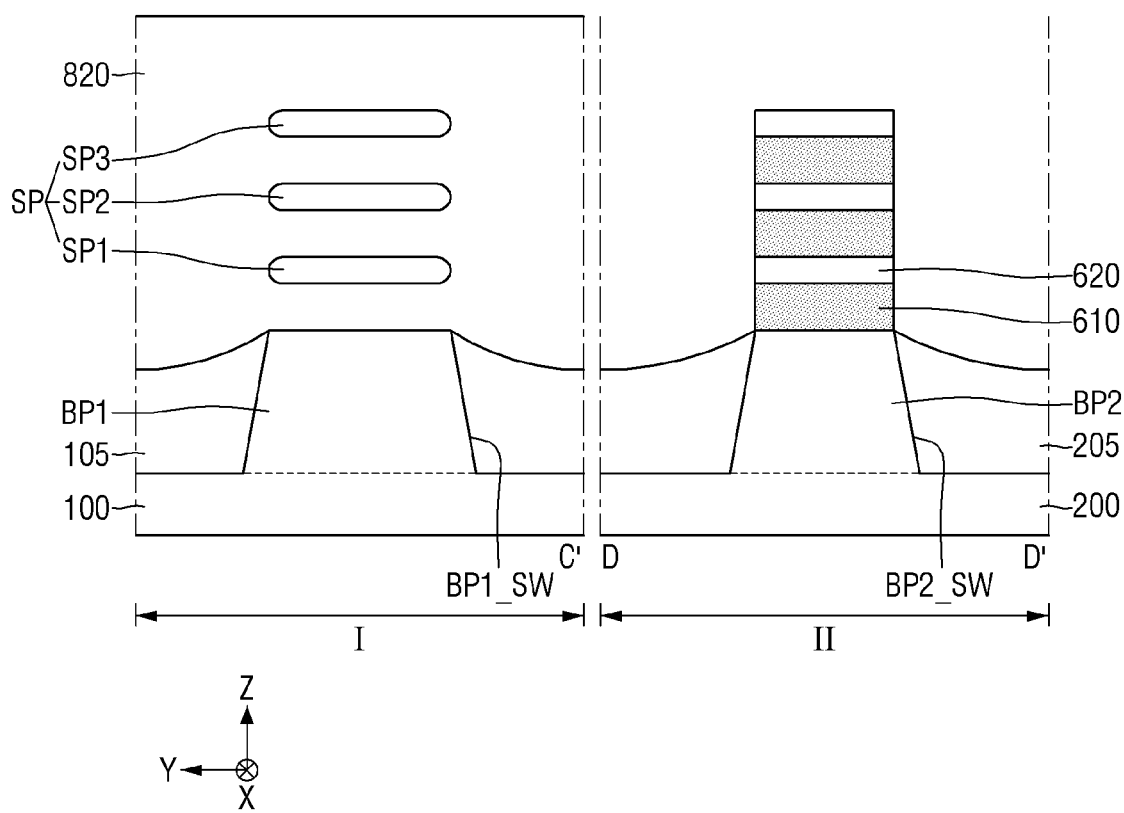

Referring to FIG. 23, in the first region I, a second sacrificial film 820 that wraps the sheet pattern SP may be formed on the first field insulating film 105 and the first lower pattern BP1. The second sacrificial film 820 may protect the sheet pattern SP in the process of forming the wire pattern (e.g., WP of FIG. 28). The second sacrificial film 820 may include, for example, silicon oxide, silicon nitride, and a combination film thereof. The second sacrificial film 820 may include, for example, but is not limited to, SOH.

Figure 24:
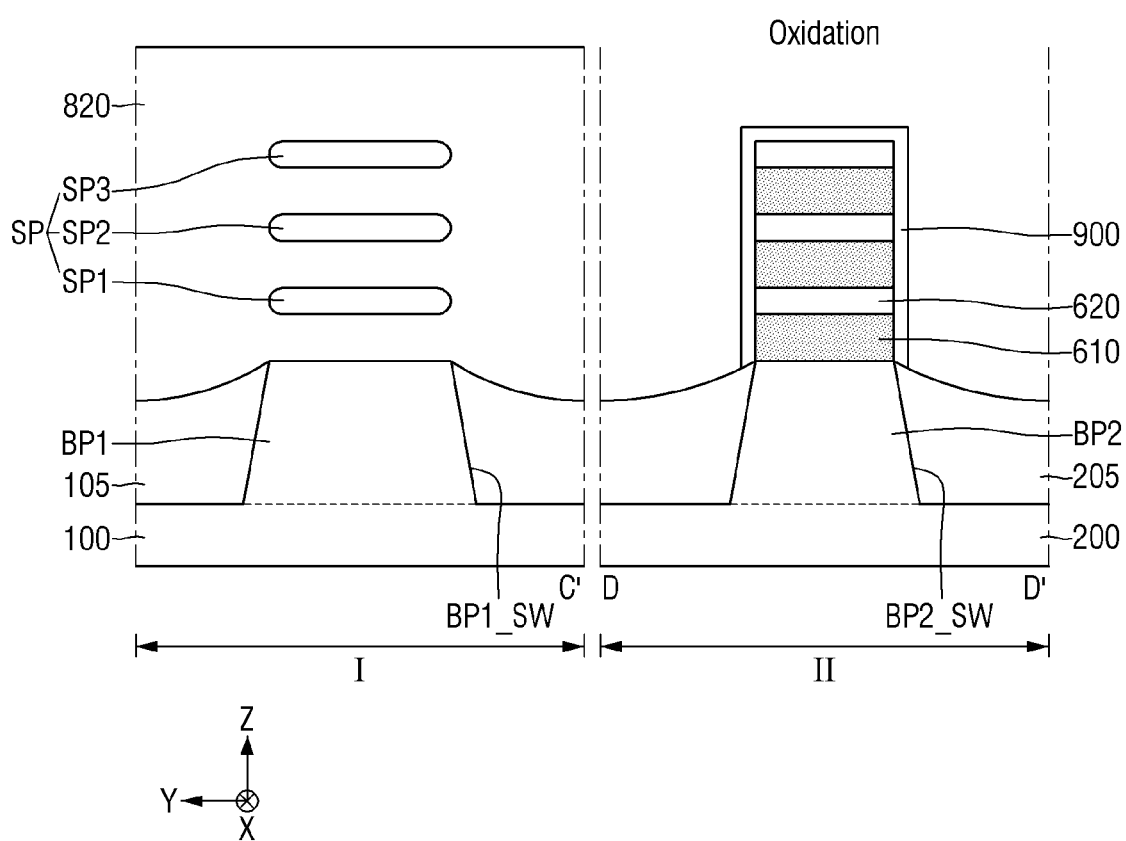

Referring to FIG. 24, an oxidation process may be performed in the second region II. As the oxidation process is performed, an oxide film 900 is formed along the side wall of the second mold film 610, the side wall of the pre-wire pattern 620, and the upper surface of the pre-wire pattern 620. The oxide film 900 may be formed, while oxidizing the second mold film 610 or the pre-wire pattern 620. The oxide film 900 may include silicon oxide ($SiO_2$). Moreover, silicon germanium (SiGe) included in the second mold film 610 may be oxidized to form silicon germanium oxide (SiGeO). Subsequently, the silicon germanium oxide (SiGeO) may be oxidized to form silicon oxide ($SiO_2$) and germanium (Ge). Germanium (Ge) may be diffused toward the pre-wire pattern 620. Silicon (Si) included in the pre-wire pattern 620 may be oxidized to form silicon oxide ($SiO_2$).

The oxidation process may include, for example, at least one of a dry oxygen ($O_2$) annealing process of 500° C. or higher, a wet annealing process of 400° C. or higher, and ozone ($O_3$) and hydrogen peroxide ($H_2O_2$) annealing process of 300° C. or higher. However, the technical idea of the present disclosure is not limited thereto.

Figure 25:
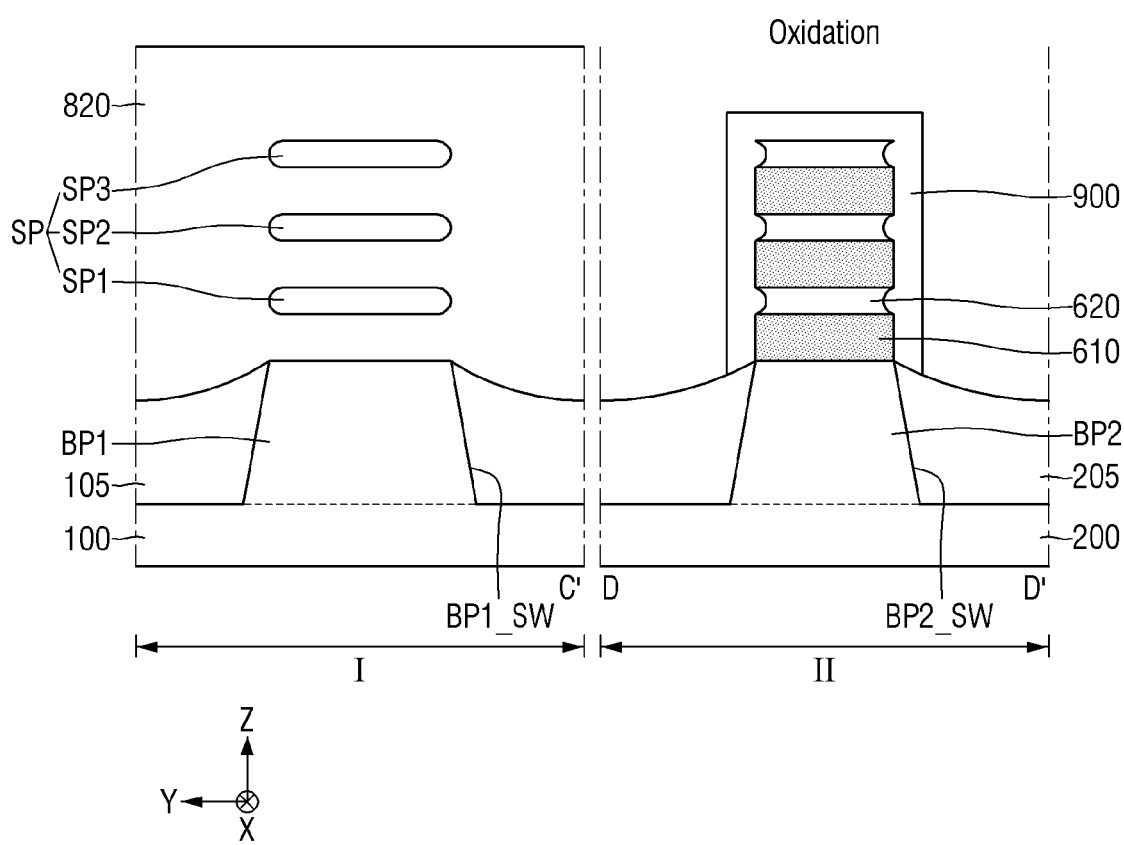

Referring to FIG. 25, the thickness of the oxide film 900 may further increase. For example, as the oxidation process is performed, an amount of oxidation of silicon germanium (SiGe) included in the second mold film 610 may increase. The amount of oxidation of silicon (Si) included in the pre-wire pattern 620 may increase. As the amount of oxidation of the second mold film 610 and the pre-wire pattern 620 increases, the thickness of the oxide film 900 may gradually increase. And, as the amount of oxidation of the pre-wire pattern 620 increases, the width of the pre-wire pattern 620 may gradually decrease.

Figure 26:
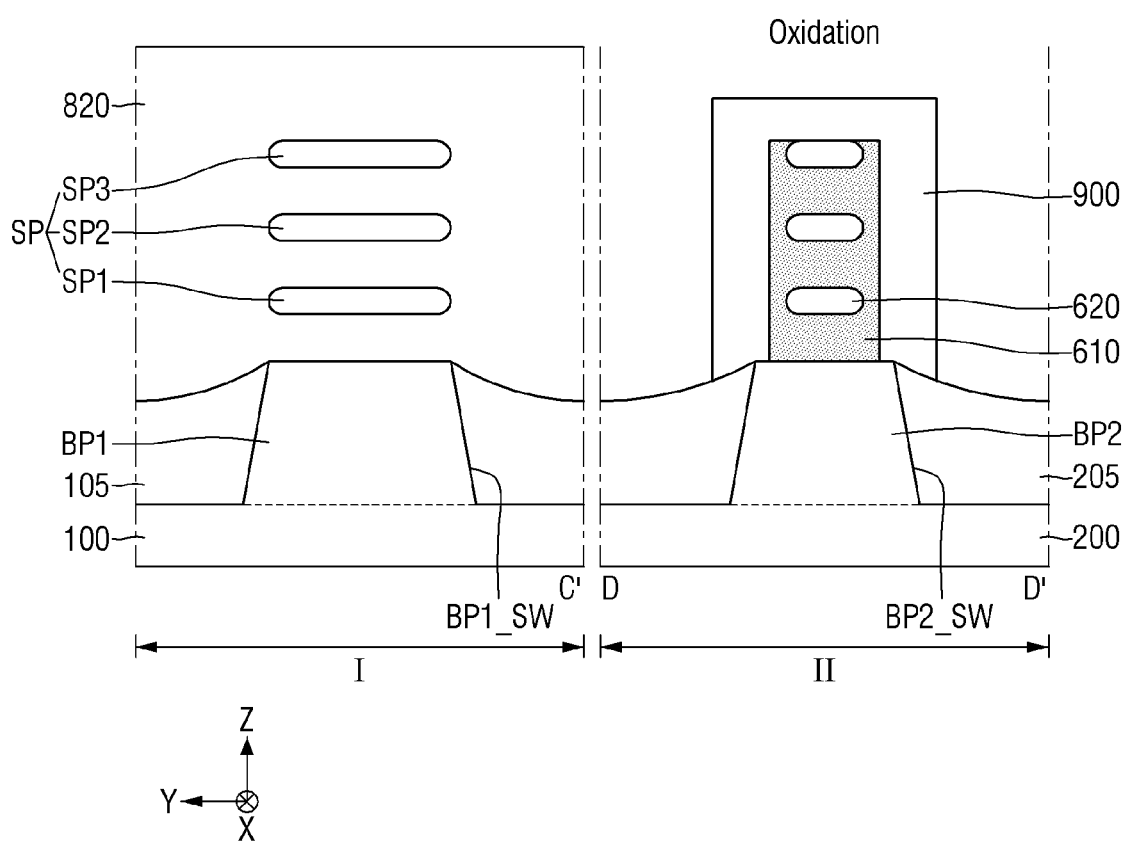

Referring to FIG. 26, germanium (Ge) generated with oxidation of the second mold film 610 is may be diffused. Germanium (Ge) may be diffused toward the pre-wire pattern 620. Silicon (Si) included in the pre-wire pattern 620 and diffused germanium (Ge) may be combined to form silicon germanium (Ge). That is, the cross-sectional area of the pre-wire pattern 620 may decrease from the viewpoint of the cross-sectional area. The cross-sectional area of the second mold film 610 may increase.

Figure 27:
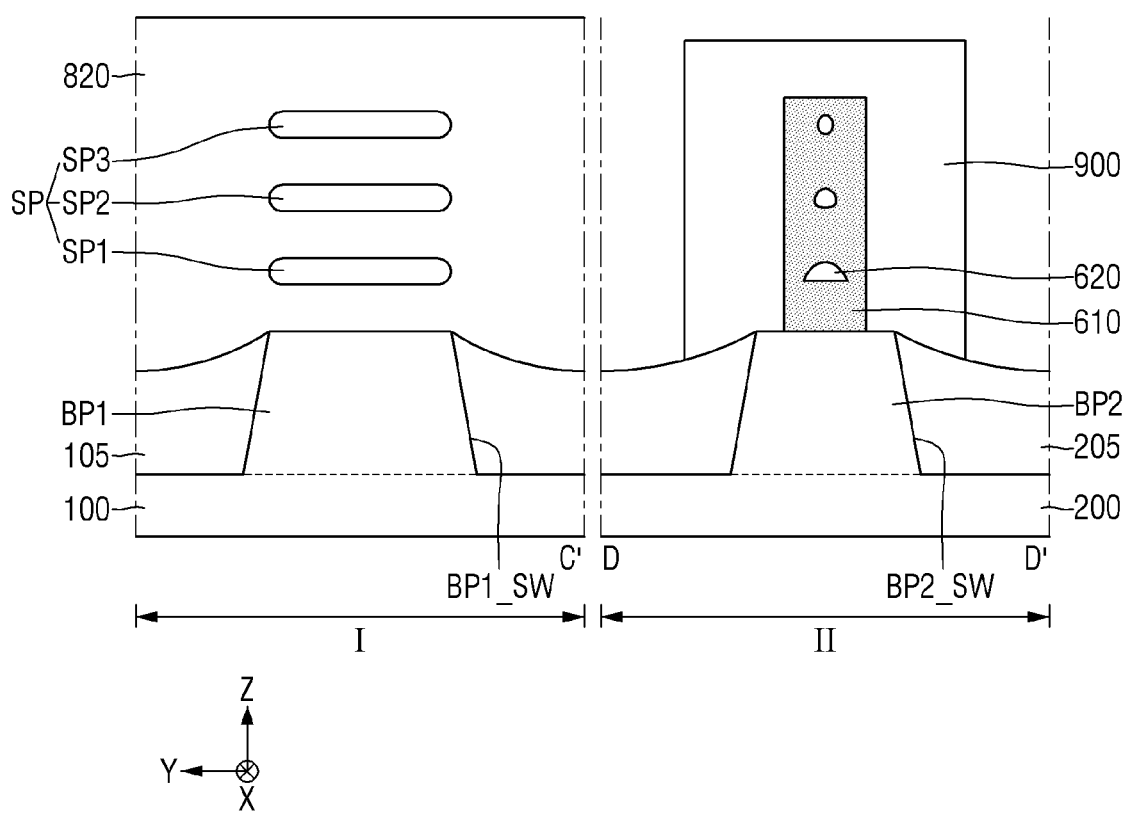

Referring to FIG. 27, the cross-sectional area of the pre-wire pattern 620 may decrease from the viewpoint of the cross-sectional area. Germanium (Ge) formed with oxidation of the second mold film 610 may be diffused into the pre-wire pattern 620. The silicon (Si) included in the pre-wire pattern 620 may be combined with the diffused germanium (Ge).

Figure 28:
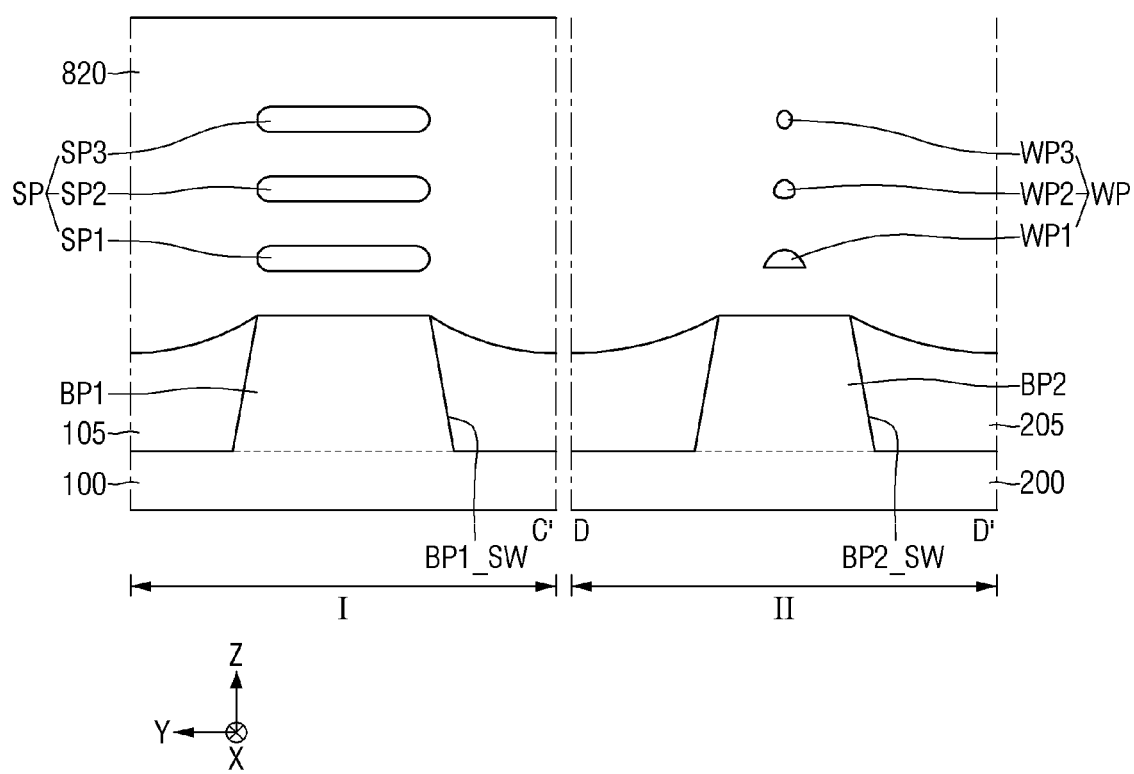

Referring to FIG. 28, the second mold film 610 may be removed to form a wire pattern WP. The second mold film 610 may be selectively removed by utilizing the process of selectively removing silicon germanium (Ge). Silicon germanium (Ge) may be removed and silicon (Si) may not be removed. The wire pattern closest to the second lower pattern BP2 may be the first wire pattern WP1. The second wire pattern WP2 may be formed on the first wire pattern WP1. The second wire pattern WP2 may be spaced apart from the first wire pattern WP1 in the third direction Z. The third wire pattern WP3 may be formed on the second wire pattern WP2. The third wire pattern WP3 may be spaced apart from the second wire pattern WP2 in the third direction Z.

Referring to FIGS. 6 and 28, the first wire pattern WP1 may have a semi-circular shape. The second wire pattern WP2 may have an elliptical shape. The third wire pattern WP3 may have an elliptical shape. However, the technical idea of the present disclosure is not limited thereto. The shape of the wire pattern WP may vary, depending on the extent to which the oxidation process is performed.

Figure 29:
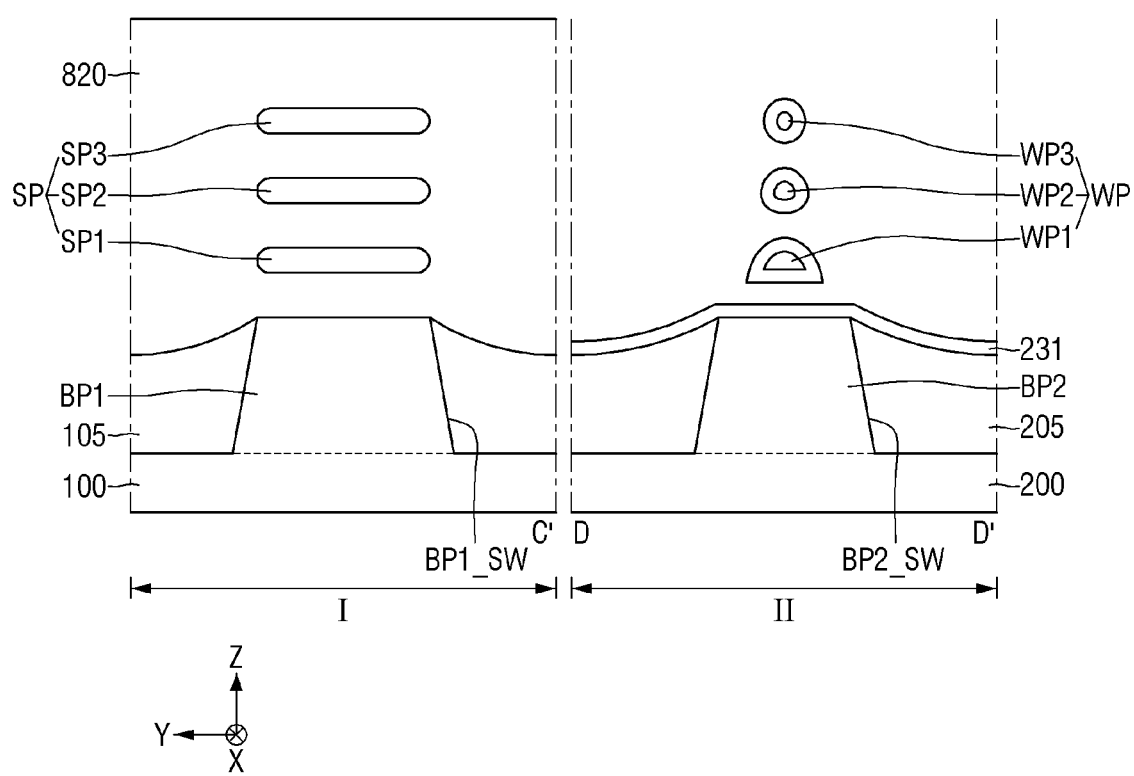
Figure 30:
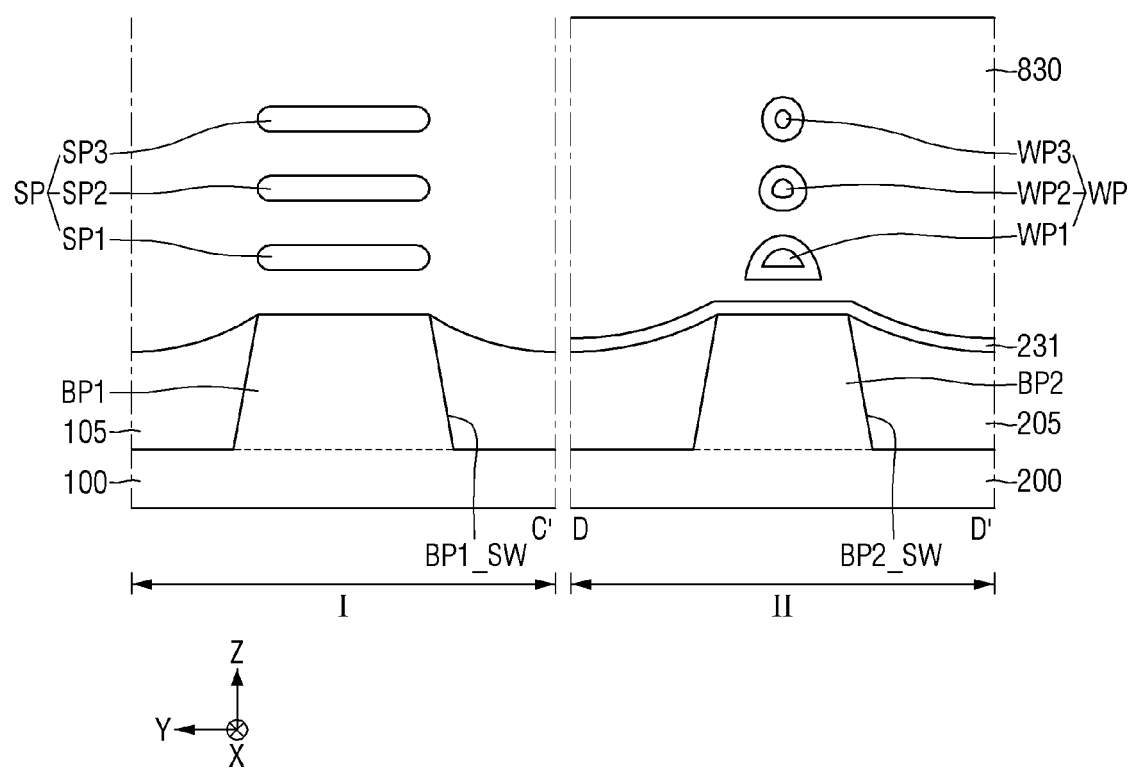
Figure 31:
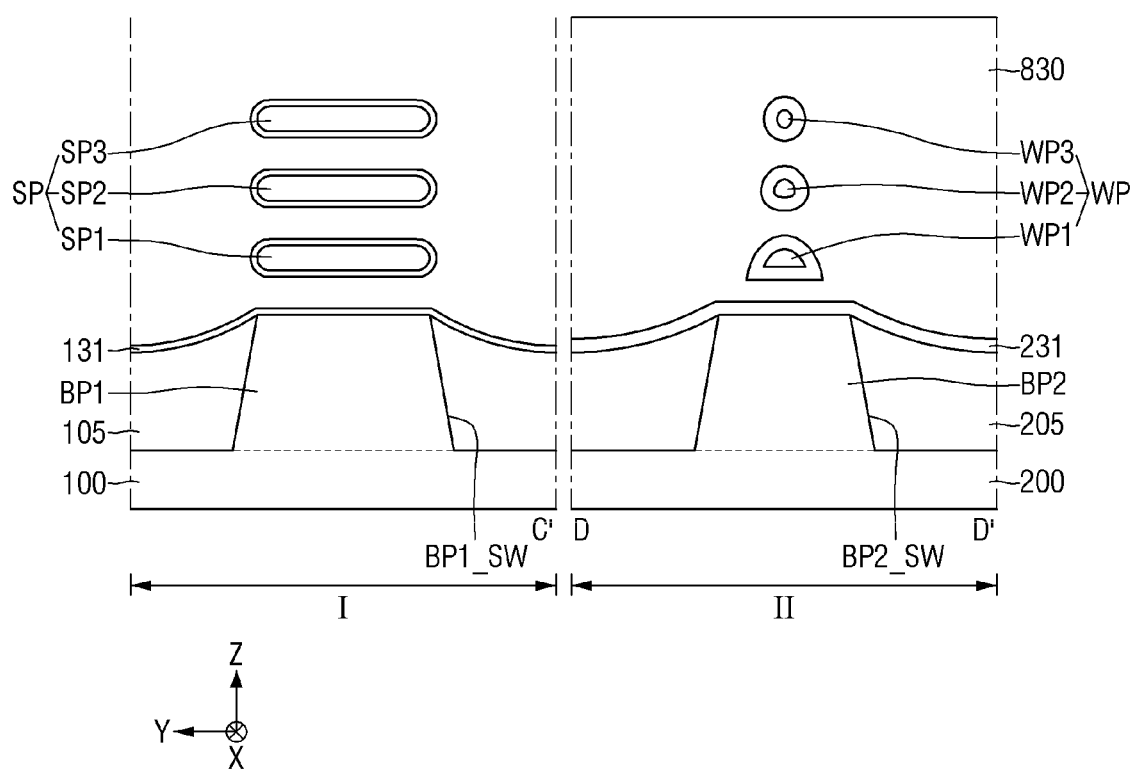
Figure 32:
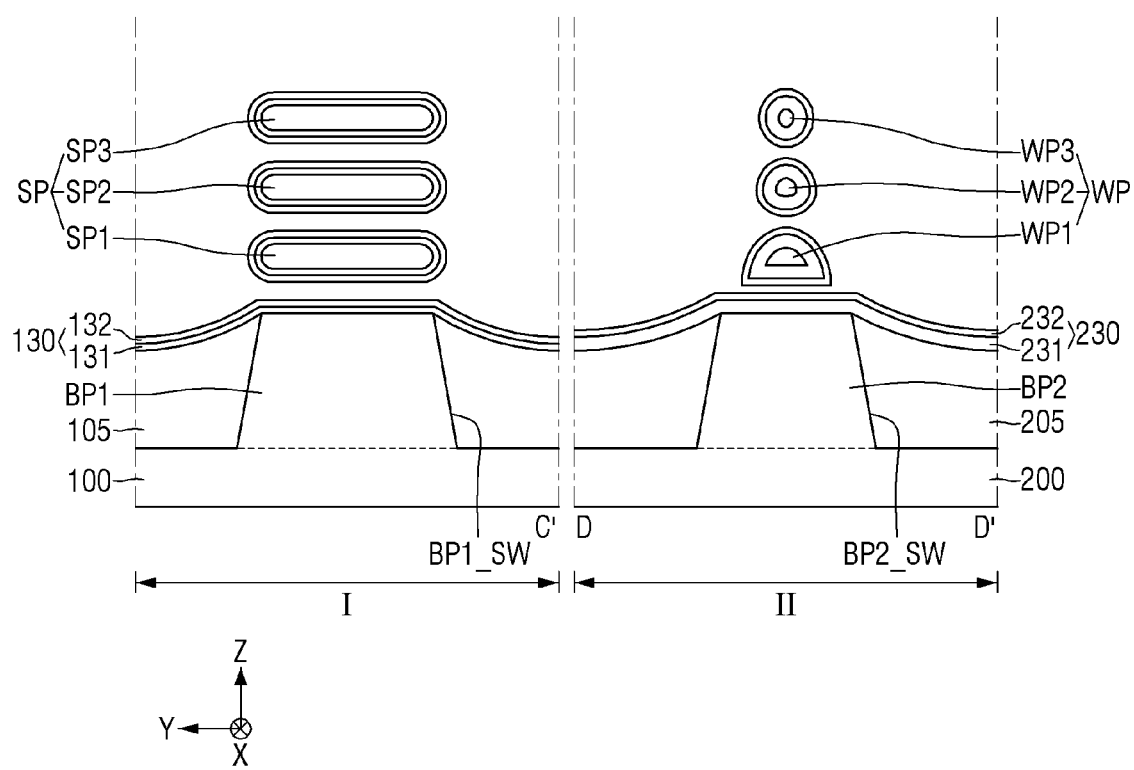

Referring to FIG. 29, the second interface film 231 may be formed on the upper surface of the second lower pattern BP2 and the upper surface of the second field insulating film 205 in the second region II. The second interface film 231 may wrap around the wire pattern WP. Referring to FIG. 30, a third sacrificial film 830 that completely covers the second interface film 231 may be formed in the second region II. The third sacrificial film 830 may be used to selectively form the first interface film 131 in the first region I. The third sacrificial film 830 may include, for example, silicon oxide, silicon nitride, and a combination film thereof. Referring to FIG. 31, the first interface film 131 may be formed on the upper surface of the first lower pattern BP1 and the upper surface of the first field insulating film 105 in the first region I. The first interface film 131 may wrap around the sheet pattern SP. Referring to FIG. 32, the third sacrificial film 830 may be removed. Subsequently, the first high dielectric constant film 132 may be formed on the first interface film 131. A second high dielectric constant film 232 may be formed on the second interface film 231. The first high dielectric constant film 132 and the second high dielectric constant film 232 may be formed at the same level, and the thickness of the first high dielectric constant film 132 may be the same as the thickness of the second high dielectric constant film 232.

Figure 33:
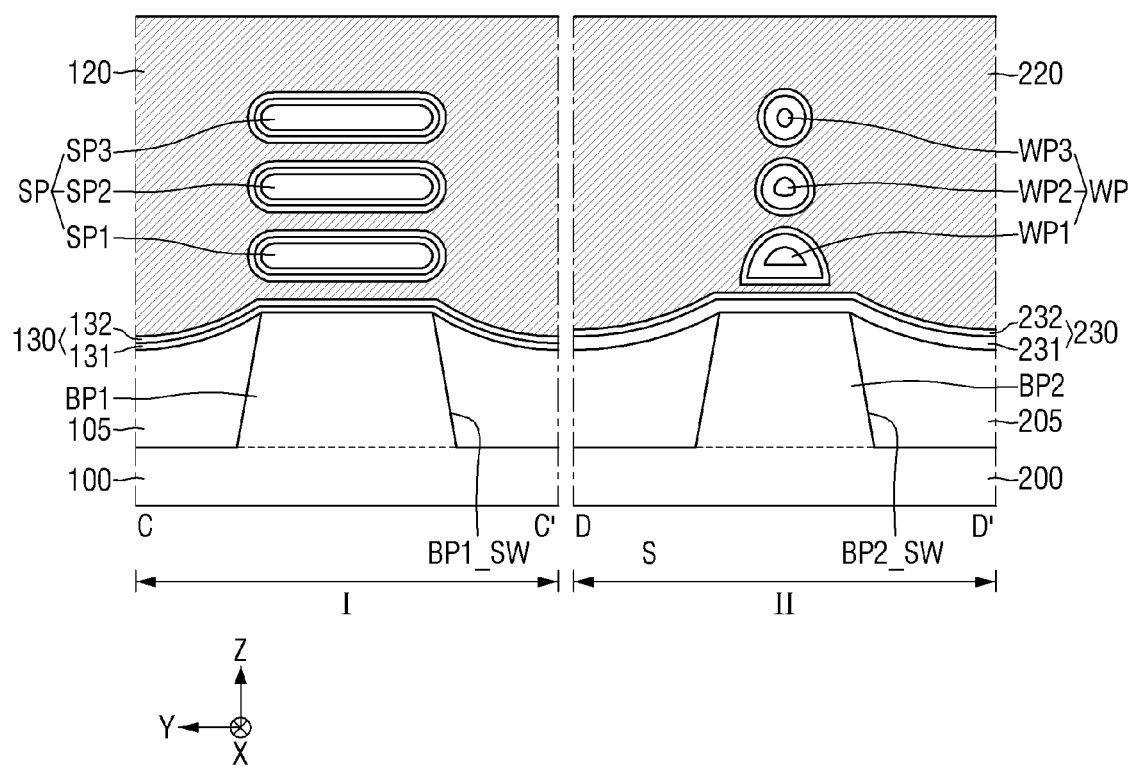

Referring to FIG. 33, the first gate electrode 120 may be formed on the first high dielectric constant film 132 in the first region I. The second gate electrode 220 may be formed on the second high dielectric constant film 232 in the second region II. The first gate electrode 120 and the second gate electrode 220 may be formed at the same level.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device, comprising:
   a semiconductor substrate having first and second regions therein;
   a first lower semiconductor pattern, which protrudes from the semiconductor substrate in the first region and extends in a first direction across the semiconductor substrate;
   a first gate electrode, which extends across the first lower semiconductor pattern and the semiconductor substrate in a second direction orthogonal to the first direction;
   a plurality of semiconductor sheet patterns, which are spaced apart from each other in a third direction orthogonal to the first and second directions to thereby define a vertical stack of semiconductor sheet patterns, on the first lower semiconductor pattern;
   a first gate insulating film which separates the plurality of semiconductor sheet patterns from the first gate electrode;
   a second lower semiconductor pattern, which protrudes from the semiconductor substrate in the second region and extends in the first direction across the semiconductor substrate;
   a plurality of wire patterns spaced apart from each other in the third direction, on the second lower semiconductor pattern; and
   a second gate insulating film wrapped around each of the plurality of wire patterns;
   wherein a thickness of the first gate insulating film less than a thickness of the second gate insulating film; and
   wherein an average thickness of the plurality of sheet patterns, as measured in the third direction, is greater than average thickness of the plurality of wire patterns, as measured in the third direction.

2. The semiconductor device of claim 1, further comprising:
   a field insulating film extending on opposing sides of the second lower semiconductor pattern;
   wherein the second lower semiconductor pattern includes a first portion which overlaps the field insulating film in the second direction, and a second portion extending on the first portion; and
   wherein a slope of a side wall of the second portion of the second lower semiconductor pattern is unequal to a slope of a side wall of the first portion of the second lower semiconductor pattern.

3. The semiconductor device of claim 1, wherein a width of an upper surface of the first lower semiconductor pattern in the second direction is greater than a width of the second lower semiconductor pattern in the second direction.

4. The semiconductor device of claim 1, wherein an upper surface of the first lower semiconductor pattern is coplanar with an upper surface of the second lower semiconductor pattern.

5. The semiconductor device of claim 1, wherein a number of the plurality of sheet patterns is greater than a number of the plurality of wire patterns.

6. The semiconductor device of claim 1, wherein the first gate insulating film includes a first interface film, and a first high dielectric constant film on the first interface film,
   wherein the second gate insulating film includes a second interface film, and a second high dielectric constant film on the second interface film, and
   wherein the first interface film is thinner than the second interface film.

7. The semiconductor device of claim 6, wherein the first high dielectric constant film and the second high dielectric constant film have the same thickness.

8. The semiconductor device of claim 1,
   wherein the plurality of semiconductor sheet patterns includes a first sheet pattern and a second sheet pattern; and wherein the first sheet pattern is located between the second sheet pattern and the first lower semiconductor pattern; and
   wherein a width of the first sheet pattern is greater than a width of the second sheet pattern, as measured in the second direction.

9. The semiconductor device of claim 1,
   wherein the plurality of wire patterns includes a first wire pattern and a second wire pattern, which is located between the second wire pattern and the second lower semiconductor pattern; and
   wherein a cross-sectional area of the first wire pattern is greater than a cross-sectional area of the second wire pattern.

10. A semiconductor device comprising:
    a first lower semiconductor pattern, which protrudes from a first region of a substrate and extends lengthwise in a first direction across the substrate;

a first gate electrode, which extends across the first lower semiconductor pattern and the substrate in a second direction orthogonal to the first direction;

a plurality of semiconductor sheet patterns, which are spaced apart from each other in a third direction orthogonal to the first and second directions to thereby define a vertical stack of semiconductor sheet patterns, on the first lower semiconductor pattern;

a first gate insulating film which separates the plurality of semiconductor sheet patterns from the first gate electrode, said first gate insulating film including a first interface film, and a first high dielectric constant film on the first interface film;

a second lower semiconductor pattern, which protrudes from a second region of a substrate and extends lengthwise in the first direction across the substrate;

a second gate electrode, which extends across the second lower semiconductor pattern and the substrate in the second direction;

a plurality of wire patterns spaced apart from each other in the third direction, on the second lower semiconductor pattern; and a second gate insulating film wrapped around each of the plurality of wire patterns, said second gate insulating film including a second interface film, and a second high dielectric constant film on the second interface film;

wherein the second interface film is thicker than the first interface film.

11. The semiconductor device of claim 10, wherein a thickness of the first high dielectric constant film is equal to a thickness of the second high dielectric constant film.

12. The semiconductor device of claim 10, further comprising:

a field insulating film extending on both sides of the second lower semiconductor pattern;

wherein the second lower semiconductor pattern includes a first portion which overlaps the field insulating film in the second direction, and a second portion extending on the first portion; and wherein a slope of a side wall of the second portion of the second lower semiconductor pattern is unequal to a slope of a side wall of the first portion of the second lower semiconductor pattern.

13. The semiconductor device of claim 10, wherein the plurality of wire patterns includes a first wire pattern and a second wire pattern; wherein the first wire pattern extends between the second lower semiconductor pattern and the second wire pattern; and wherein cross-sectional area of the first wire pattern is greater than a cross-sectional area of the second wire pattern.

14. The semiconductor device of claim 10, wherein a width of an upper surface of the first lower semiconductor pattern is greater than a width of an upper surface of the second lower semiconductor pattern, as measured in the second direction.

15. A semiconductor device, comprising:

a first lower semiconductor pattern, which protrudes from a first region of a substrate and extends lengthwise in a first direction across the substrate;

a first gate electrode, which crosses the first lower semiconductor pattern in a second direction, which is orthogonal to the first direction;

first to third sheet patterns, which are vertically stacked on the first lower semiconductor pattern, and spaced apart from the first lower semiconductor pattern in a third direction orthogonal to the first direction and the second direction;

a first gate insulating film, which surrounds the first to third sheet patterns, and includes a first interface film, and a first high dielectric constant film on the first interface film;

a second lower semiconductor pattern, which protrudes from a second region of the substrate and extends lengthwise in the first direction across the substrate;

a second gate electrode extending in the second direction on the second lower semiconductor pattern;

first to third wire patterns, which are vertically stacked on the second lower semiconductor pattern, and spaced apart from the second lower semiconductor pattern in the third direction; and a second gate insulating film, which wraps around the first to third wire patterns, and includes a second interface film and a second high dielectric constant film on the second interface film;

wherein from a viewpoint of a cross-sectional area, the first wire pattern includes a first surface extending in the second direction, and a second surface connected to both ends of the first surface and having a concave curved surface with respect to the second lower pattern;

wherein from the viewpoint of the cross-sectional area, the second wire pattern has a first sub-wire pattern in which a width in the second direction gradually increases as its distance from the second lower pattern increases, and a second sub-wire pattern placed on the first sub-wire pattern in which a width in the second direction gradually decreases as its distance from the second lower pattern increases, and a height of the first sub-wire pattern in the third direction is smaller than a height of the second sub-wire pattern in the third direction; and wherein from the viewpoint of the cross-sectional area, the third wire pattern has an elliptical shape in which a width in the second direction is smaller than a width in the third direction.

16. The semiconductor device of claim 15, wherein a width of an upper surface of the first lower pattern in the second direction is greater than a width of an upper surface of the second lower pattern in the second direction.

17. The semiconductor device of claim 15, wherein a thickness of the first interface film is less than a thickness of the second interface film; and wherein a thickness of the first high dielectric constant film equals a thickness of the second high dielectric constant film.

18. The semiconductor device of claim 15, further comprising:

a field insulating film extending on both sides of the second lower semiconductor pattern;

wherein the second lower semiconductor pattern includes a first portion which overlaps the field insulating film in the second direction, and a second portion on the first portion; and wherein a slope of a side wall of the second portion of the second lower semiconductor pattern is different from a slope of a side wall of the first portion of the second lower semiconductor pattern.

19. The semiconductor device of claim 15, wherein at least two of the first to third sheet patterns have unequal cross-sectional areas.

20. The semiconductor device of claim 19, wherein at least two of the first to third wire patterns have unequal cross-sectional areas.

\* \* \* \* \*